(12) United States Patent
Ohe et al.

(10) Patent No.: US 8,415,196 B2
(45) Date of Patent: Apr. 9, 2013

(54) METHOD FOR FORMING SEMICONDUCTOR THIN FILM AND METHOD FOR MANUFACTURING THIN-FILM SEMICONDUCTOR DEVICE

(75) Inventors: Takahiro Ohe, Tokyo (JP); Miki Kimijima, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/734,620

(22) PCT Filed: Dec. 25, 2008

(86) PCT No.: PCT/JP2008/073592
§ 371 (c)(1),
(2), (4) Date: May 12, 2010

(87) PCT Pub. No.: WO2009/084584
PCT Pub. Date: Jul. 9, 2009

(65) Prior Publication Data
US 2010/0233846 A1    Sep. 16, 2010

(30) Foreign Application Priority Data
Dec. 27, 2007   (JP) .................................. 2007-335882

(51) Int. Cl.
*H01L 51/40*   (2006.01)

(52) U.S. Cl.
USPC ................. 438/99; 438/82; 257/40; 257/635; 257/E51.012

(58) Field of Classification Search .................. 438/82; 257/E51.026, E51.012, 40, 635, E51.005, 257/E29.136, E29.029; 136/263
See application file for complete search history.

(56) References Cited

U.S. PATENT DOCUMENTS

2006/0131563 A1* 6/2006 Salleo et al. .................... 257/40
2006/0291033 A1* 12/2006 Yang et al. ..................... 359/296

FOREIGN PATENT DOCUMENTS

| EP | 1737027 A1 | 12/2006 |
|---|---|---|
| JP | 2005-243822 | 9/2005 |
| JP | 2007-208255 | 8/2007 |

OTHER PUBLICATIONS

Takahiro Ohe et al., "Solution-processed organic thin-film transistors with vertical nanophase separation" Appl. Phys. Lett. 93, 053303 2008.*
Bernasik et al., Lamellar structures formed in spin-case blends of insulating and conducting polymers. Synth Met. Aug.1, 2004;144(3):253-7.
Björström et al., Vertical phase separation in spin-coated films of a low bandgap polyfluorene/PCBM blend-Effects of specific substrate interaction. Appl Surface Science. Feb. 1, 2007;253(8):3906-12.
Corcoran et al., Increased efficiency in vertically segregated thin-film conjugated polymer blends for light-emitting diodes. Appl Phys Lett. Jan. 13, 2003;82(2):299-301.

* cited by examiner

*Primary Examiner* — Evan Pert
*Assistant Examiner* — Mark A Laurenzi
(74) *Attorney, Agent, or Firm* — Wolf, Greenfield & Sacks, P.C.

(57) ABSTRACT

The present invention provides a method for forming a semiconductor thin film, which is capable of suppressing decrease in mobility due to heating and characteristic deterioration due to the decrease in mobility and which is capable of forming a semiconductor thin film with improved heat resistance by more simple procedures. A solution in which a plurality of types of organic materials including an organic semiconductor material are mixed is applied or printed on a substrate to form a thin film, and the plurality of types of organic materials are phase-separated by a process of drying the thin film. As a result, a layered structure semiconductor thin film is obtained, in which an intermediate layer b composed of an organic insulating material is sandwiched between two semiconductor layers a and a'.

20 Claims, 13 Drawing Sheets

RELATION BETWEEN ΔGm AND MOLECULAR WEIGHT
OF HIGH MOLECULE (PaMS) MIXED

RELATION BETWEEN MOBILITY AND
MOLECULAR WEIGHT OF PaMS MIXED
WITH TIPS PENTACENE

FIG. 15
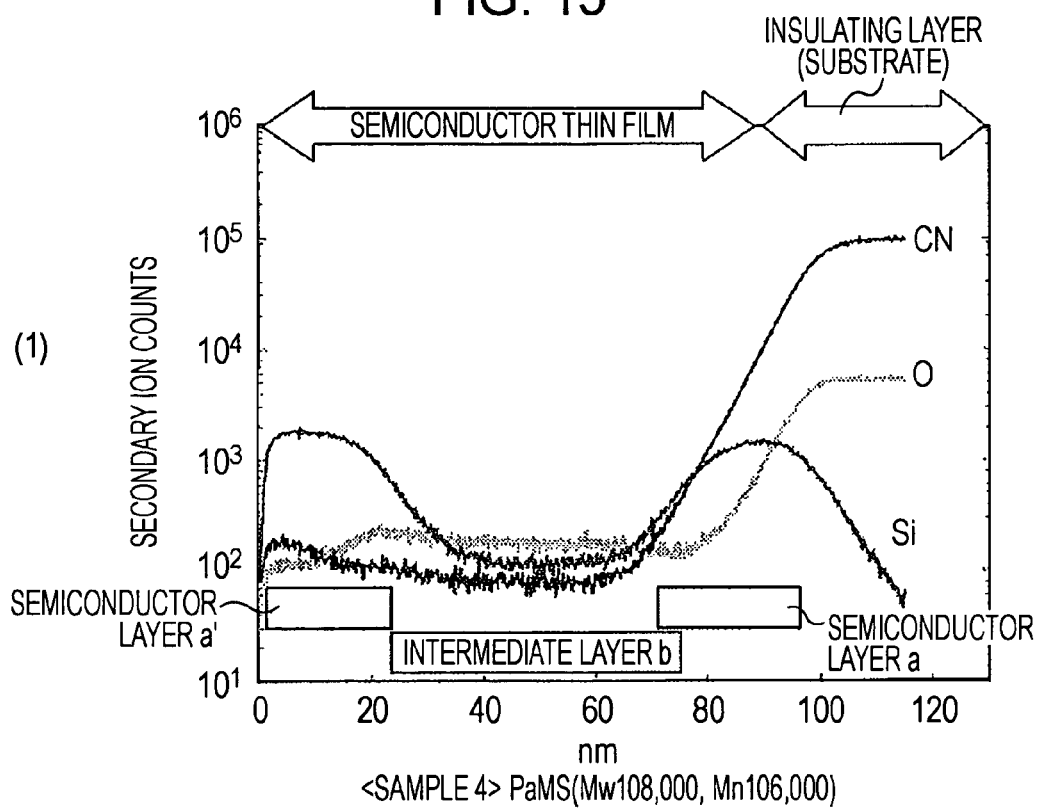
(1) <SAMPLE 4> PaMS(Mw108,000, Mn106,000)
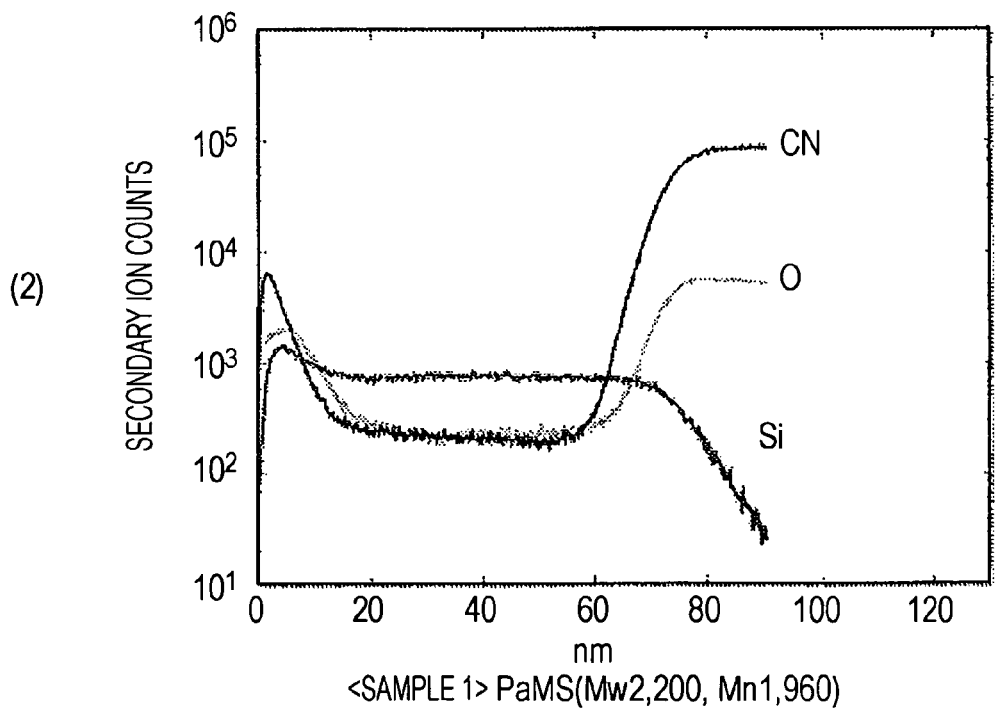
(2) <SAMPLE 1> PaMS(Mw2,200, Mn1,960)

RELATION BETWEEN MOBILITY AND MOLECULAR WEIGHT OF PS MIXED WITH TIPS PENTACENE

<CYCLIC OLEFIN COPOLYMER>

METHOD FOR FORMING SEMICONDUCTOR THIN FILM AND METHOD FOR MANUFACTURING THIN-FILM SEMICONDUCTOR DEVICE

TECHNICAL FIELD

The present invention relates to a method for forming a semiconductor thin film, particularly a method for forming an organic semiconductor thin film which is capable of suppressing characteristic deterioration due to heating, and a method for manufacturing a thin-film semiconductor device using the forming method.

BACKGROUND ART

In manufacturing thin-film semiconductor devices using organic semiconductor thin films, such as organic thin-film transistors (organic TFT), the organic semiconductor thin films can be formed by applying a coating/printing process. For example, an organic semiconductor thin film composed of an organic semiconductor material with a single configuration can be obtained by coating a substrate with a solution prepared by dissolving the organic semiconductor material in a solvent and then drying the resulting coating. Therefore, attempts can be made to increase the substrate size and decrease the manufacturing cost as compared with conventional semiconductor devices using inorganic semiconductor materials such as silicon (Si) and the like. In addition, the coating/printing process or the like has a low process temperature and is thus capable of forming on plastic substrates, and the thin-film semiconductor devices are expected as semiconductor devices having flexibility. As an example of this, it has been reported that a back plane is prepared by providing organic TFT on a plastic substrate, and a flat-panel display device such as a liquid crystal display device, an OLED display device, or the like is manufactured using the back plane.

As materials constituting organic semiconductor thin films, for example, a wide range of materials, such as polythiophene, pentacene, rubrene, and the like, have been investigated, and it has been reported that some of the thin-film semiconductor devices have mobility equivalent to or higher than that of thin-film semiconductor devices using semiconductor thin films composed of amorphous silicon (for example, refer to "Applied Physics Letters", {HYPERLINK "http://scitation.aip.org/dbt/dbt.jsp?KEY=APPLAB&Volume=69"; Volume 69}, Issue 26, 1996, p. 4108-4110).

However, thin-film semiconductor devices using organic semiconductor thin films have the problem that mobility is degraded by heating. In an actual experiment, it was confirmed that a mobility of 0.14 $cm^2/Vs$ before heating becomes a mobility of $6\times10^{-4}$ $cm^2/Vs$ in a state of heating to 180° C. in a nitrogen atmosphere, and the mobility is degraded to 1/100 or less by heating. Since organic semiconductor materials are not oxidized because of heating in a nitrogen atmosphere, and the organic semiconductor materials used are not thermally decomposed even by heating to 180° C., it is found that the deterioration of mobility due to heating is not caused by changes in properties of the organic semiconductor materials.

Accordingly, an object of the present invention is to provide a method for forming a semiconductor thin film, which is capable of suppressing decrease in mobility due to heating and characteristic deterioration due to the decrease in mobility and which is capable of forming a semiconductor thin film with improved heat resistance according to simple procedures, and provide a method for manufacturing a thin-film semiconductor device by applying the forming method.

DISCLOSURE OF INVENTION

In order to achieve this object, a method for forming a semiconductor thin film and a method for manufacturing a thin-film semiconductor device according to the present invention are characterized in that a solution in which a plurality of types of organic materials including an organic semiconductor material are mixed is applied or printed on a substrate to form a thin film, and the plurality of types of organic materials are phase-separated by a process of drying the thin film to form a layered structure semiconductor thin film including a semiconductor layer composed of the organic semiconductor material. This phase separation produces the semiconductor thin film including at least two semiconductor layers. The phase separation of the organic materials is realized by adjusting the molecular weights of the plurality of types of organic materials constituting the solution.

As described in examples below, it was confirmed by experiments that in a layered structure semiconductor thin film obtained by the method for forming a semiconductor thin film, deterioration in mobility due to heating can be suppressed to a low level as compared with a single-layer structure semiconductor thin film. Therefore, in a thin-film semiconductor device using the semiconductor thin film, characteristic deterioration due to heating is prevented. A possible factor of suppression of deterioration in mobility is that thermal expansion of the semiconductor thin film is suppressed by the layered structure. In addition, particularly, in the above-described forming method, the layered structure semiconductor thin film is formed by one time of a coating step.

As described above, according to the present invention, in a semiconductor thin film and a thin-film semiconductor device using the thin film, a layered structure semiconductor thin film capable of suppressing decrease in mobility due to heating and characteristic deterioration due to the decrease in mobility can be obtained according to very simple procedures.

BRIEF DESCRIPTION OF DRAWINGS

FIG. 15 is a SIMS profile of a semiconductor thin film of each of samples 1 and 4 prepared using PaMS having respective molecular weights.

BEST MODE FOR CARRYING OUT THE INVENTION

Embodiments of the present invention are described in detail below on the basis of the drawings. Hereinafter, the embodiments are described in the order of a configuration of semiconductor thin film, a method for forming a semiconductor thin film and a thin-film semiconductor device using a semiconductor thin film.
<Semiconductor Thin Film>

Figure 1:
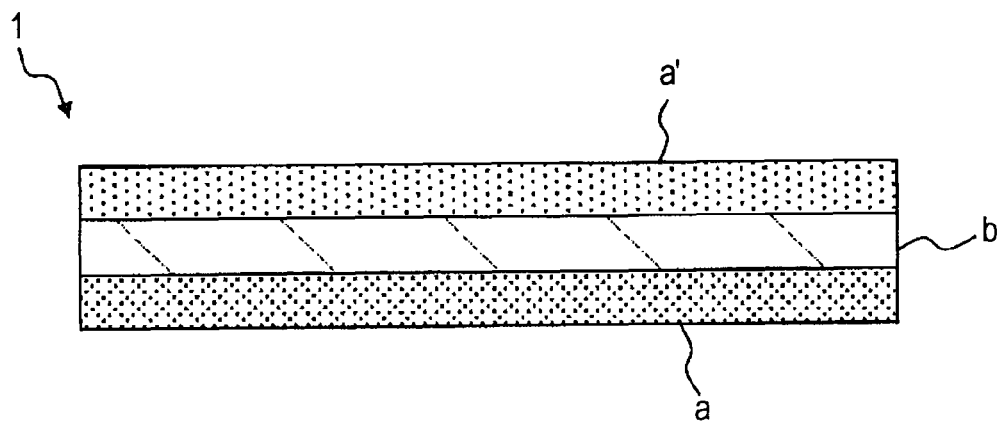
FIG. 1 is a sectional view of a semiconductor thin film obtained by applying a forming method of the present invention.

FIG. 1 is a sectional view showing an example of a configuration of a semiconductor thin film obtained by applying the present invention. A semiconductor thin film 1 shown in this figure is characterized by being a so-called semiconductor composite thin film including at least two semiconductor layers a and a' in a layered structure. As shown in the figure, these semiconductor layers a and a' may be arranged in a state of further holding an intermediate layer b composed of a different material as a main component between the two semiconductor layers a and a'. In this case, the two semiconductor layers a and a' may be composed of different materials or the same material. In addition, the state of the two semiconductor layers is not limited to one in which the layers are completely separated, and the materials constituting the layers may be mixed near the interface therebetween.

The intermediate layer b is composed of a material different from that of the two semiconductor layers a and a', and the semiconductor thin film 1 including the intermediate layer b may be provided with desired semiconductivity as a whole. Therefore, the intermediate layer b may be composed of, for example, an insulating material having lower conductivity than that of the two semiconductor layers a and a' or a semiconductor material having conductivity in the same level as that of the two semiconductor layers a and a'. In addition, as another example of the intermediate layer b, the intermediate layer b may be composed of a conductive material having higher conductivity than that of the two semiconductor layers a and a'. Also, the intermediate layer b itself may be configured in a layered structure. In addition, when the intermediate layer b is made of a mixed material, a material of the semiconductor layers a and a' may be contained as a constituent material.

Besides the above, the semiconductor thin film 1 may be configured by directly laminating the two semiconductor layers a and a'. In this case, the two semiconductor layers a and ' are composed of different materials. Further, if one of the two semiconductor layers a and a' constitutes one of the surfaces of the semiconductor thin film 1, another layer may be further provided on the outside of the other of the semiconductor layers a and a'.

In the semiconductor thin film 1 as described above, organic semiconductor materials and inorganic semiconductor materials such as silicon and the like are used as semiconductor materials constituting the semiconductor layers a and a' and the intermediate layer b composed of a semiconductor material. As the organic semiconductor materials, low-molecular semiconductor materials such as acene compounds, oligothiophene derivatives, phthalocyanine derivatives, perylene derivatives, and the like are preferably used. Conjugated low-molecular materials are polycrystalline or crystalline. The organic semiconductor materials may be high-molecular organic semiconductor materials such as poly(3-hexyl-thiophene) and the like. In particular, the material constituting the semiconductor layers a and a' is preferably a conjugated low-molecular material. On the other hand, the intermediate layer b is preferably composed of a high-molecular material, and the high-molecular material may be amorphous.

In addition, as the insulating material constituting the intermediate layer b, organic insulating materials and inorganic insulating materials such as silicon oxide and the like can be used. The organic insulating materials may be low-molecular materials or high-molecular materials, and when crosslinking reaction is possible, the materials may be either crosslinked or not. The organic insulating materials are preferably high-molecular insulating materials. Materials used as such materials include polystyrene, polycarbonate, polydimethylsiloxane, nylon, polyimide, cyclic olefin-copolymers, epoxy polymers, cellulose, polyoxymethylene, polyolefin polymers, polyvinyl polymers, polyester polymers, polyether polymers, polyamide polymers, fluorocarbon polymers, biodegradable plastics, phenol resins, amino resins, unsaturated polyester resins, diallyl phthalate resins, epoxy resins, polyimide resins, polyurethane resins, silicone resins, copolymers including combination of various polymer units, and the like.

In addition, each of the layers forming the above layered structure may be formed with a single composition or formed using a mixed material containing a mixture of a plurality of materials. Further, the state of the layers is not limited to one in which the layers are completely separated, and the materials constituting the layers may be mixed near the interface therebetween. In addition, a component of each of the layers may be present at a different component ratio in another layer. For example, the semiconductor material of the semiconductor thin films a and a' may be present in the intermediate layer b. In this case, the composition ratio and the constituent material ratio are different from the semiconductor layers a and a' so that the semiconductor layers a and a' can be discriminated from the intermediate layer b as another layer.

In addition, as a particularly preferred example of the semiconductor thin film 1, a semiconductor layer a using a polycrystalline or crystalline conjugated low-molecular material/ an insulating intermediate layer b using an amorphous high-molecular material/a semiconductor layer a' using a polycrystalline or crystalline conjugated low-molecular material is exemplified. In addition, as another example of the semiconductor thin film 1, a layered structure including semiconductor layers a and a' configured using a high-molecular semiconductor material and an intermediate layer b sandwiched between the semiconductor layers a and a' and configured using a high-molecular semiconductor material of a different type from the semiconductor layers a and a' is exemplified.

In the semiconductor thin film 1 having the above-described layered structure, it is preferred to select the materials so that the mixing Gibbs energy ($\Delta Gm$) of a plurality of materials constituting the semiconductor thin film 1 shows a positive value. This makes it possible to obtain the semiconductor thin film 1 in which organic materials are spontaneously phase-separated during the formation of the semiconductor thin film 1 which will be described below. In addition, a plurality of materials constituting the layers are selected using, as selection factors, the molecular structure and molecular weight of a material.

As an example, when the semiconductor layer a is configured using TIPS pentacene (6,13-bis(triisopropylsilylethynyl)pentacene) which is a conjugated low-molecular material, the intermediate layer b is configured using poly(alphamethylstyrene) (PaMS), polystyrene (PS), or a cyclic olefin copolymer, which is a high-molecular material. In this case, a high-molecular material having a number-average molecular weight and weight-average molecular weight of 5,000 or more, preferably 20,000 or more, is applied at a weight mixing ratio of 1:1 so that the mixing Gibbs energy ($\Delta Gm$) shows a positive value.

As described in examples below, it was confirmed by experiments that the semiconductor thin film 1 having the above-described layered structure can suppress deterioration in mobility due to heating as compared with a semiconductor thin film having a single-layer structure.

<Method for Forming Semiconductor Thin Film>

Next, as a method for forming the semiconductor thin film 1 having the above-described layered structure, description is made of a method for forming a semiconductor thin film in which organic materials in a thin film formed by coating or printing are spontaneously phase-separated by applying the present invention.

First, a plurality of types of organic materials including the above-described organic semiconductor material are dissolved and mixed in a solvent to prepare a solution. At this time, for example, an organic material (e.g., the above-described organic insulating material) constituting the intermediate layer is also dissolved and mixed in the same solvent.

Here, a plurality of types of organic materials used for forming the layers of the semiconductor thin film 1 having the layered structure are selected so that the mixing Gibbs energy ($\Delta Gm$) shows a positive value. In this way, the material constituting each of the layers is selected using the molecular structure and molecular weight of the material as selection factors. Such selection of the materials produces phase separation of the constituent materials in a state in which the materials are dissolved and mixed in a solvent and applied.

That is, considering a mixed system based on statistical thermodynamics, whether or not a plurality of types of materials are mixed is determined by the Gibbs energy (G) of the whole system, i.e., mixing Gibbs energy ($\Delta Gm$) represented by the equation (6) below. When the mixing Gibbs energy ($\Delta Gm$) is negative, the system undergoes mixing because mixing is more stable with lower energy. In contrast, when the mixing Gibbs energy ($\Delta Gm$) is positive, the system undergoes phase separation without mixing because the mixed system is unstable with high energy.

[Equation 4]

$$\Delta Gm = \Delta Hm - T \cdot \Delta Sm \quad (6)$$

$\Delta H$: enthalpy difference of system
$\Delta S$: entropy difference of system
T: Kelvin temperature Here, the enthalpy difference ($\Delta Hm$) of the system represented in the equation (6) is determined by the types of the materials mixed and is an amount which does not depend on the molecular weight of a high molecule. In contrast, the entropy difference ($\Delta Sm$) represented in the equation (1) is an amount which depends on the molecular weight of a high molecule. Therefore, it is found that even with the same types of materials and at the same mixing ratio, the mixing Gibbs energy ($\Delta Gm$) changes with changes in the molecular weight of a high molecule. Therefore, it is found that as well as the molecular structure of a material, the molecular weight is important as a selection factor for the material constituting each of the layers.

In addition, in particular in a mixed system containing a high-molecular material, whether or not a plurality of types of materials are mixed can be determined by the Flory-Huggins theory based on statistical thermodynamics using a lattice model. In particular, for a mixed system configured using a high-molecular material and a low-molecular material, mixing Gibbs energy ($\Delta Gm$) according to the Flory-Huggins theory of the equation (1) below can be applied, and when the mixing Gibbs energy is a positive value, the system undergoes phase separation without undergoing mixing.

[Equation 5]

$$\Delta Gm = kN_T T(\chi_{12}\phi_1\phi_2) + kN_T T(\phi_1 \ln \phi_1 + \phi_2/x \cdot \ln \phi_2) \quad (1)$$

k . . . Boltzmann constant
$N_T$ . . . total number of lattice points ($N_T = N_1 + xN_2$)
wherein $N_1$ . . . number of low-molecular weight molecules
$N_2$ . . . number of high-molecular weight molecules
x . . . number of high-molecular weight units
T . . . absolute temperature (K)
$\chi_{12}$ . . . interaction parameter (Flory χ parameter)
$\phi_1$ . . . $N_1/N_T$
$\phi_2$ . . . $xN_2/N_T$ However, the equation (1) is the Flory-Huggins theory for a mixed system of an organic solvent and a high molecule. Therefore, when the Flory-Huggins theory of the equation (1) is applied to a mixed system of a low-molecular material (low-molecular semiconductor material) and a high-molecular material, the number x of high-molecular units in the equation (1) may be adjusted according to the molecular weight of the low-molecular semiconductor material.

Here, the purpose of achieving a positive value of the mixing Gibbs energy ($\Delta Gm$) according to the Flory-Huggins theory of the above equation (1) depends on the values of the four parameters of $\chi_{12}$, $\phi_1$, $\phi_2$, and x among the parameters constituting the equation (1). Among the four parameters, $\phi_1$ and $\phi_2$ are values depending on the number of low-molecular weight molecules and the number of high-molecular weight molecules and the number x of high-molecular units, respectively. Therefore, it is also found from the equation (1) that as well as the molecular structure of a material mixed, the molecular weight thereof is important as a selection factor for a material constituting each of the layers.

In addition, when the materials are selected to satisfy the equation (2) below composed of the four parameters extracted from the above equation (1), a system composed of a low-molecular weight molecule and a high-molecular weight molecule undergoes phase separation without undergoing mixing.

[Equation 6]

$$[(\chi_{12}\phi_1\phi_2)+(\phi_1 \ln \phi_1+\phi_2/x \cdot \ln \phi_2)]>0 \quad (2)$$

On the other hand, for a mixed system composed of only a plurality of types of high-molecular materials, mixing Gibbs energy ($\Delta Gm$) according to the Flory-Huggins theory of the equation (3) below can be applied, and when the mixing Gibbs energy is a positive value, the system undergoes phase separation without undergoing mixing.

[Equation 7]

$$\Delta Gm = kN_T T(\chi_{12}\phi_1\phi_2)+kN_T T(\phi_1/x_1 \cdot \ln \phi_1+\phi_2/x_2 \cdot \ln \phi_2) \quad (3)$$

k ... Boltzmann constant
$N_T$ ... total number of lattice points ($N_T = N_1 + xN_2$)
wherein $N_1$ ... number of high-molecular weight molecules 1
$N_2$ ... number of high-molecular weight molecules 2
$x_1$ ... number of units of high-molecular weight molecules 1
$x_2$ ... number of units of high-molecular weight molecules 2
T ... absolute temperature (K)
$\chi_{12}$ ... interaction parameter (Flory $\chi$ parameter)
$\phi_1$ ... $x_1 N_1/N_T$
$\phi_2$ ... $x_2 N_2/N_T$ The aim of achieving a positive value of the mixing Gibbs energy ($\Delta Gm$) according to the Flory-Huggins theory of the above equation (3) depends on the values of the five parameters of $\chi_{12}$, $\phi_1$, $\phi_2$, $x_1$, and $x_2$ among the parameters constituting the equation (3). Among the five parameters, $\phi_1$ and $\phi_2$ are values depending on the numbers of high-molecular weight molecules and the numbers $x_1$ and $x_2$ of units of high-molecular molecules, respectively. Therefore, it is also found from the equation (3) that as well as the molecular structure of a material mixed, the molecular weight thereof is important as a selection factor for a material constituting each of the layers.

In addition, when the materials are selected to satisfy the equation (4) below composed of the five parameters extracted from the above equation (3), a system composed of a plurality of types of high-molecular weight materials undergoes phase separation without undergoing mixing.

[Equation 8]

$$[(\chi_{12}\phi_1\phi_2)+(\phi_1/x_1 \cdot \ln \phi_1+\phi_2/x_2 \cdot \ln \phi_2)]>0 \quad (4)$$

Figure 2:
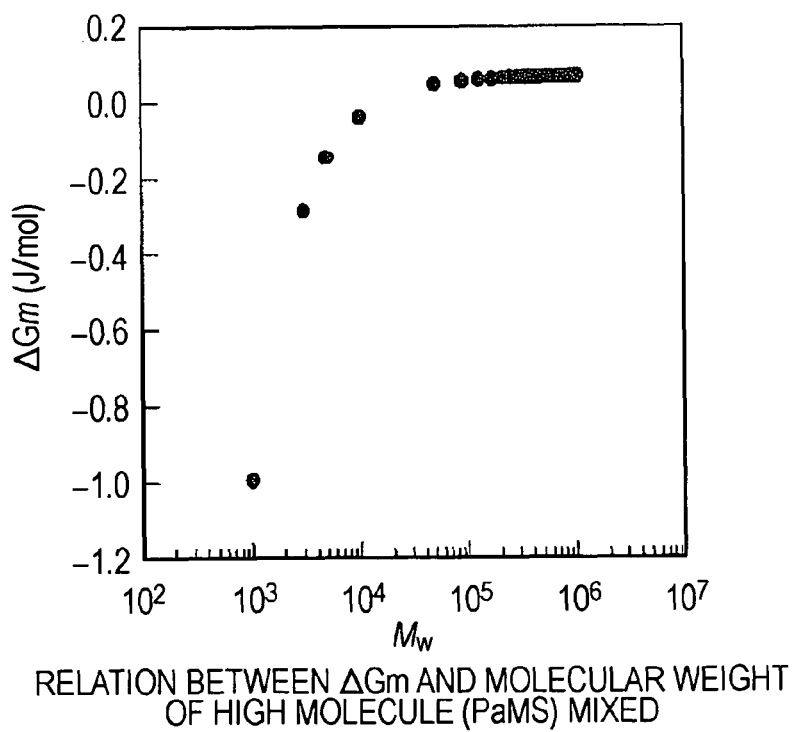
FIG. 2 is a graph showing a relation between the molecular weight of PaMS and mixing Gibbs energy ($\Delta mG$) determined by the Flory-Huggins theory in a TIPS pentacene/PaMS mixed system.

As an example, FIG. 2 shows a relation between the molecular weight of PaMS and mixing Gibbs energy ($\Delta Gm$) determined by the Flory-Huggins theory of the above-described equation (1) in a TIPS pentacene/poly(alpha-methylstyrene) (PaMS) mixed system. The mixing ratio was 1:1. The TIPS pentacene is a conjugated low-molecular semiconductor material constituting the semiconductor layers a and a'. In addition, PaMS is a high-molecular insulating material constituting the intermediate layer b.

The graph of FIG. 2 indicates that even with the same types of the materials mixed and at the same mixing ratio, the mixing Gibbs energy ($\Delta Gm$) changes with changes in the molecular weight of the high-molecular (PaMS). Specifically, the mixing Gibbs energy ($\Delta Gm$) becomes zero when the molecular weight of the high-molecular (PaMS) is about 10,000, the mixing Gibbs energy ($\Delta Gm$) becomes minus within a range of molecular weights of less than 10,000, and the mixing Gibbs energy ($\Delta Gm$) becomes plus within a range of molecular weights of over 10,000.

In addition, it is found that when the molecular weight increases to some extent, the mixing Gibbs energy ($\Delta Gm$) little changes. From this viewpoint, as a matter of course, not only entropy but also enthalpy greatly contribute, and a material is selected in consideration of balance between entropy and enthalpy using, as factors, the molecular structure and molecular weight of a material.

From the above-described viewpoint, a combination which causes phase separation into layers is selected from materials selected so as to show a positive value of the mixing Gibbs energy ($\Delta Gm$) and dissolved and mixed in a solvent to prepare a solution. However, since the temperature (T) is also involved in entropy difference ($\Delta Sm$), the temperature of formation of a system is also important. Therefore, a combination which causes phase separation in layers may be selected from materials selected so as to show a positive value of the mixing Gibbs energy ($\Delta Gm$) at any one of the temperatures in a practical temperature range of about −20° C. to 200° C. In addition, the practical temperature range of about −20° C. to 200° C. is a substrate heat-resistant temperature, for example, when a substrate for forming a thin-film semiconductor device is a plastic substrate.

As an example, when TIPS pentacene which is a conjugated low-molecular material is used as a semiconductor material, as described above, poly(alpha-methylstyrene) (PaMS), polystyrene (PS), or a cyclic olefin copolymer is used as a high-molecular material. In this case, a high-molecular material having a molecular weight of 5,000 or more, preferably 20,000 or more, is applied so as to show a positive value of the mixing Gibbs energy ($\Delta Gm$).

Next, the prepared solution is applied or printed on the substrate by a spin coating method, a printing method, or a coating method such as an ink jet method or the like to form a thin film. In addition, herein, the printing method is considered as a type of coating method, and a thin film formed by the coating method including the printing method is referred to as a "coating film" hereinafter.

Next, the coating film is dried to remove the solvent in the coating film and spontaneously phase-separate a plurality of types of organic materials contained in the coating film.

As a result, the organic materials are phase-separated to laminate organic semiconductor materials, resulting in a layered structure semiconductor thin film including the semiconductor layers a and a'. In addition, when the coating film contains an organic insulating material, a semiconductor thin film in which an insulating layer composed of the organic insulating material is laminated is obtained. In this case, the semiconductor thin film 1 is obtained in which, for example, the organic semiconductor material deposits on the interface side of the coating film to form a semiconductor layer, and an insulating layer is sandwiched as the intermediate layer b between the two semiconductor layers a and a'. In this case, for example, the two semiconductor layers a and a' are composed of the same material.

In addition, in the above-described process of drying the coating film, spontaneous phase separation of the organic materials in the coating film is realized by adjusting the molecular weight of each of a plurality of types of organic materials constituting the coating film (i.e., the solution). As another example, the phase separation is realized by a combination of a plurality of types of organic materials constituting the coating film (i.e., the solution).

The above-described forming method can obtain a layered structure semiconductor thin film by one time of coating deposition. In addition, there occurs no problem that when an upper layer is deposited, a lower layer serving as a base layer is corroded.

In addition, in particular, when coating (printing) deposition is performed using a solution prepared by dissolving and mixing a plurality of types of organic materials including an organic semiconductor material, as described in examples below, it was found that coating/printing performance is improved, thereby improving in-plane uniformity of the resulting semiconductor thin film. For example, when a low-molecular material is used as the organic semiconductor material, it is difficulty for a solution prepared by dissolving the organic material to have viscosity necessary for coating deposition, and aggregation often occurs after coating and drying. The film becomes discontinuous due to aggregation, resulting in difficulty in forming a semiconductor thin film with in-plane uniformity.

Therefore, it was confirmed that as described above, when a plurality of types of organic materials including an organic semiconductor material is dissolved in a solvent, a high-molecular material (e.g., a high-molecular insulating material) is used as another organic material used in combination with the organic semiconductor material so that a solution with sufficient viscosity can be prepared, and aggregation little occurs in the drying step after coating by spin coating, ink jet, or the like, thereby forming a semiconductor thin film having in-plane uniformity.

Figure 3:
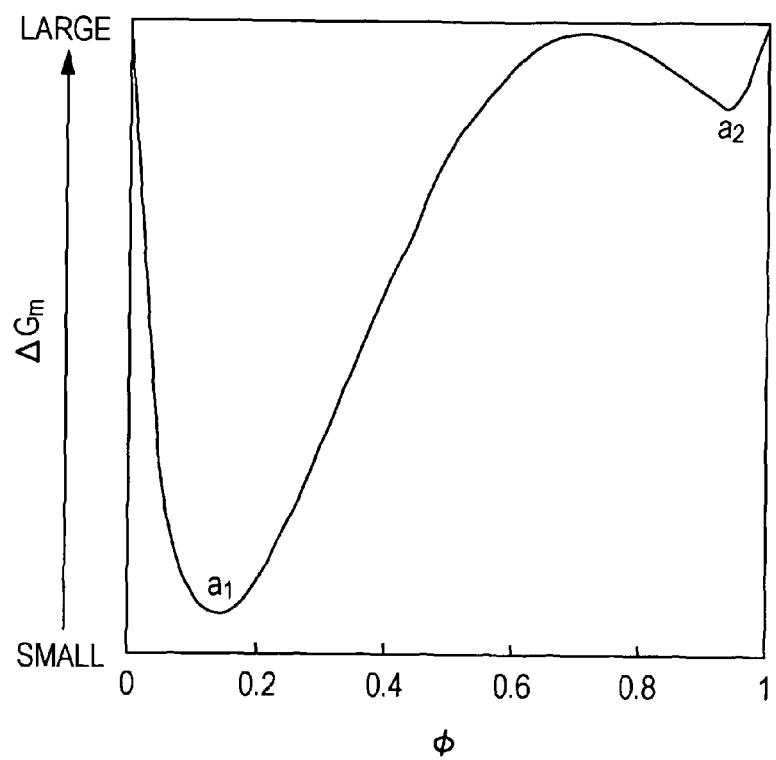
FIG. 3 is a graph showing an example of a case in which each mixing Gibbs energy ($\Delta Gm$) is regarded as a function of variable $\phi$ represented by equation (6).

In addition, even when the mixing Gibbs energy (ΔGm) of each of the equations (1) and (3)<0, phase separation may be caused by combining materials having two or more minimum points $a_1$ and $a_2$ as shown in FIG. 3 assuming that the mixing Gibbs energy is a function of variable φ shown by equation (5) below.

[Equation 9]

$$\phi = \phi_2/(\phi_1 + \phi_2) \quad (5)$$

In a graph of FIG. 3, a convex region has higher energy than the minimum points $a_1$ and $a_2$. Therefore, in some cases, components unnecessary for reaching the minimum points $a_1$ and $a_2$ are removed to the outside of the system so that the system advances to a lower-energy mixing ratio, thereby causing phase separation.

<Thin-film Semiconductor Device-1>

Figure 4:
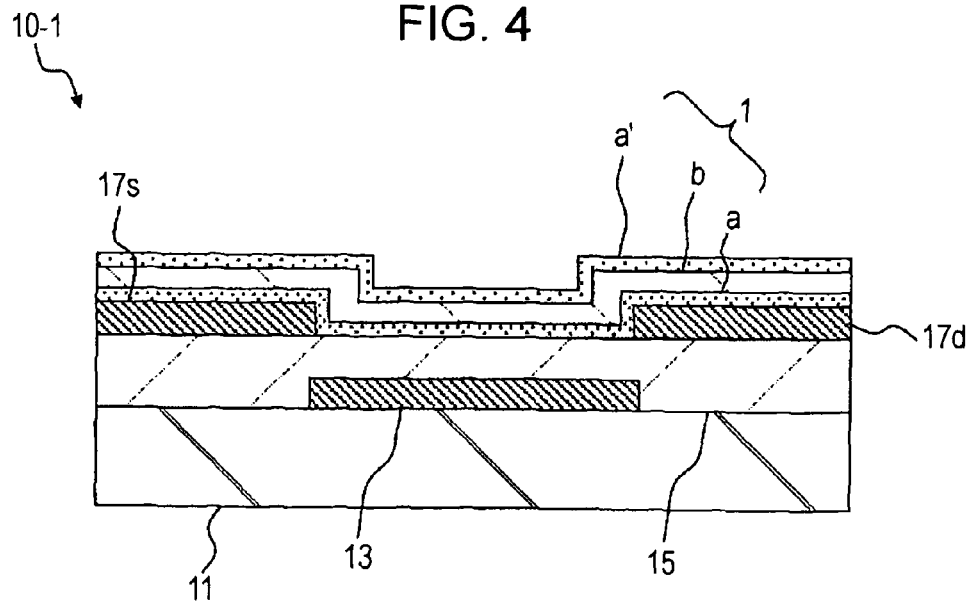
FIG. 4 is a sectional configuration diagram showing a first example of a thin-film semiconductor device obtained by applying the present invention.

FIG. 4 is a sectional configuration diagram showing a first example of a thin-film semiconductor device using a semiconductor thin film formed by applying the present invention. A thin-film semiconductor device 10-1 shown in this figure is a bottom-contact-bottom-gate (BCBG) type thin-film transistor in which a pattern of a gate electrode 13 is formed on a substrate 11. In addition, a gate insulating film 15 is provided to cover the gate electrode 13, and a source electrode 17s and a drain electrode 17d are formed on the gate insulating film 15 by patterning. The source electrode 17s and the drain electrode 17d are provided to oppose to each other on both sides of the gate electrode 13 so as to hold the gate electrode 13 therebetween. There may be overlap regions between the gate electrode and the source and drain electrodes. In addition, the above-described layered structure semiconductor thin film 1 is provided in a state of contact with the gate insulating film 15, the source electrode 17s, and the drain electrode 17d over the source electrode 17s and the drain electrode 17d.

In addition, in particular, in the first example, one of at least two semiconductor layers constituting the above-described semiconductor thin film 1 is provided in a state of contact with the source electrode 17s, the gate insulating film 15, and the drain electrode 17d. Herein, for example, the semiconductor thin film 1 having a three-layer structure in which the intermediate layer b is sandwiched between the semiconductor layers a and a' is provided in a state of covering the gate electrode 13 on which the source electrode 17s and the drain electrode 17d are formed, and the semiconductor layer a of the layers a and a' is provided in a state of contact with the source electrode 17s, the gate insulating film 15, and the drain electrode 17d. Such a semiconductor thin film 1 is formed by the formation method of the above-described example 1 or a second example.

Here, when all layers constituting the semiconductor thin film 1 are composed of organic materials, the semiconductor thin film 1 can be obtained by a low-temperature process using a printing method. Therefore, a plastic substrate can be used as the substrate 11. In this case, by configuring the gate insulating film 15 using an organic material, the gate insulating film 15 can be formed by a low-temperature process using a printing method. Further, the gate electrode 13, the source electrode 17s, and the drain electrode 17d can be formed by a conventional sputtering method, CVD method, plating method, or evaporation method for forming a metal electrode, and a low-temperature process using an ink jet method, a micro contact method, or a printing method such as a screen printing method or the like using a dispersion of nano particles of Au, Ag, or the like, a metal complex solution, or a conductive molecule solution.

In addition, in the thin-film semiconductor device 10-1 having the above configuration, it was confirmed by experiments that deterioration of mobility due to heating can be suppressed to a low level using the semiconductor thin film 1 described with reference to FIG. 1 as an active layer as compared with a configuration in which a single-layer structure semiconductor thin film is used as an active layer. As a result, decrease in mobility due to heating and characteristic deterioration due to the mobility decrease can be suppressed, thereby permitting an attempt to improve heat resistance.

Figure 5:
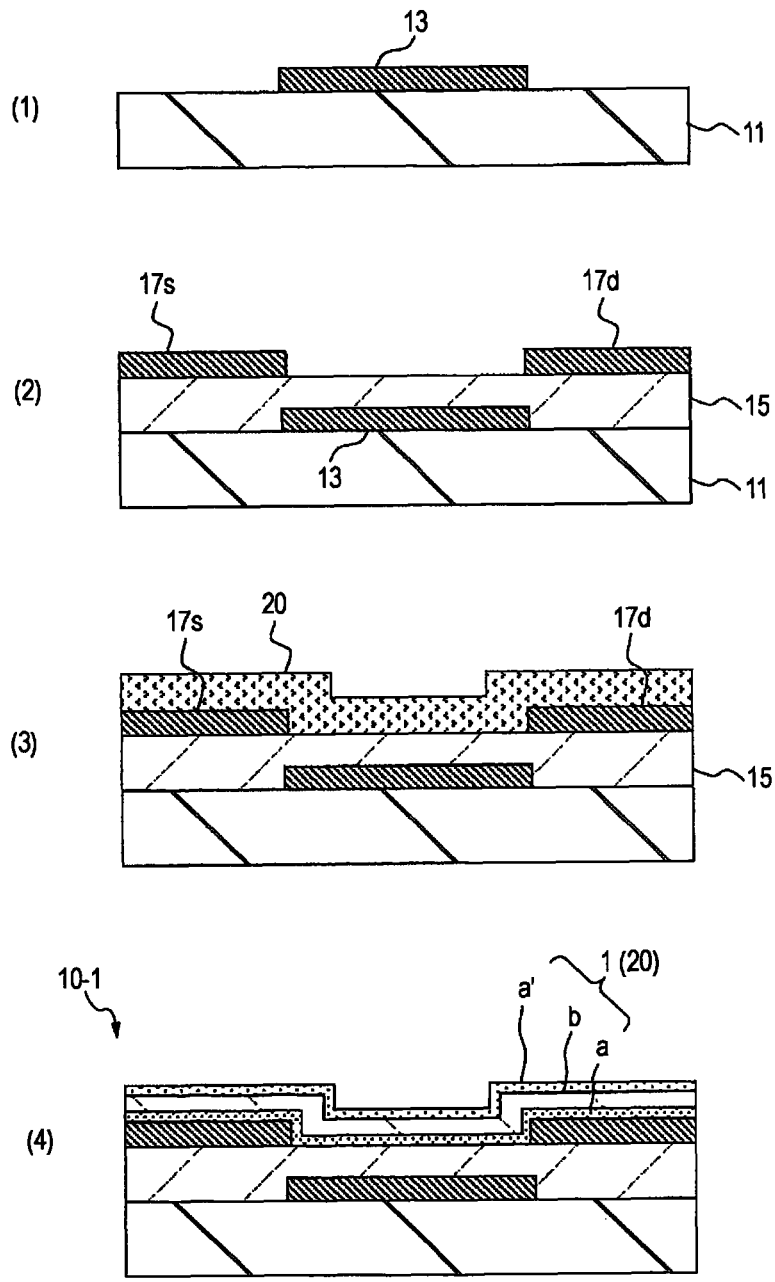
FIG. 5 is a sectional process diagram showing procedures for manufacturing the first example of the thin-film semiconductor device obtained by applying the present invention.

Next, the process for manufacturing the thin-film semiconductor device 10-1 is described using a sectional process drawing of FIG. 5.

First, as shown in FIG. 5(1), the substrate 11 having at least a surface composed of an insulating material is prepared. Then, the gate electrode 13 is formed on the substrate 11. In this case, first, a metal material film of, for example, tungsten (W), tantalum (Ta), molybdenum (Mo), aluminum (Al), chromium (Cr), titanium (Ti), copper (Cr), nickel (Ni), or the like, is deposited by a sputtering method, an evaporation method, or a plating method. Then, a resist pattern (not shown) is formed on the metal material film by photolithography, and the metal material film is etched using the resist pattern as a mask. As a result, the gate electrode 13 is pattern-formed on the substrate 11. As another method, the gate electrode 13 may be pattern-formed by a printing technique such as ink jet printing, screen printing, offset printing, gravure printing, or the like using ink paste containing gold (Au) fine particles, silver (Ag) fine particles, or the like.

Thereafter, as shown in FIG. 5(2), the gate insulating film 15 is deposited as an organic insulating layer on the substrate 11 in a state of covering the gate electrode 13. At this time, for example, an organic high-molecular material such as polyvinyl phenol, PMMA, polyimide, fluorocarbon resin, or the like is deposited by a coating method or a printing method. The gate insulating film 15 may be formed by a CVD method or sputtering method using an inorganic material such as silicon oxide, silicon nitride, or the like or may be formed as a multilayer film of an organic high-molecular material and an inorganic material by combining the above-described methods.

Next, the source electrode 17s and the drain electrode 17d are pattern-formed. The source electrode 17s and the drain electrode 17d may be formed by the same method as that for forming the gate insulating electrode 13. If required, the source electrode 17s and the drain electrode 17d pattern-formed may be surface-treated to form metal material layers, which form low-ohmic junctions, on the surfaces of the source electrode 17s and the drain electrode 17d.

Next, as shown in FIG. 5(3), a solution prepared by dissolving and mixing a plurality of types of organic materials including an organic semiconductor material is applied or printed to form a coating film 20 on the gate insulating film 15 on which the source electrode 17s and the drain electrode 17d have been formed. The solution constituting the coating film 20 is prepared by dissolving in a solvent an organic semiconductor material for forming the semiconductor layers (a, a') and an organic insulating material for forming the intermediate layer (b). The plurality of types of organic materials used are selected as described above in <Method for forming semiconductor thin film>. The solvent may be any solvent as long as it dissolves the materials selected.

In addition, the coating film 20 using the solution is formed by applying or printing the prepared solution on the substrate by a coating method such as a spin coating method, a printing method, or an ink jet method.

Next, as shown in FIG. 5(4), the coating film 20 is dried to remove the solvent in the coating film 20 and spontaneously phase-separate, into layers, the plurality of types of organic materials contained in the coating film 20. Consequently, the organic materials are phase-separated to laminate organic semiconductor materials, forming the layered structure semiconductor thin film 1 including the semiconductor layers a and a'. In addition, if an organic insulating material is contained in the coating film 20, the semiconductor thin film 1 in which an insulating layer composed of the organic insulating material is laminated is obtained.

In this case, for example, the organic semiconductor material is deposited to constitute the semiconductor layer a on the interface side of the coating film, and the semiconductor thin film 1 including the insulating layer sandwiched as the intermediate layer b between the two semiconductor layers a and a' is obtained. In this case, for example, the two semiconductor layers a and a' are composed of the same material.

In addition, it is as described above in <Method for forming semiconductor thin film> that the above-described spontaneous phase separation of the organic materials in the step of drying the coating film is realized depending on the molecular weight of each of the plurality of types of organic materials constituting the coating film (i.e., the solution) or combination of the plurality of types of organic materials.

As described above, the same bottom-gate-bottom-contact thin film transistor as described with reference to FIG. 4 is obtained as the thin-film semiconductor device 10-1.

In addition, when a plurality of thin-film transistors are formed on the substrate 11, element separation is performed by patterning the semiconductor thin film 1. In this case, the semiconductor thin film 1 may be patterned after being formed. Alternatively, a bank pattern (not shown) of a shape in which the formation portion of the semiconductor thin film 1 is surrounded may be previously formed, and then the formation of the coating film 20 and phase separation may be performed to form the semiconductor thin film 1 in a patterned state.

In addition, in order to improve the reliability and environment resistance of the transistor, the thin film transistor is preferably covered with a protecting film composed of polyvinyl alcohol, parylene, silicon nitride, silicon oxide, or the like.

Also, the semiconductor thin film 1 provided with at least the two semiconductor layers a and a' may be formed by separately depositing the layers in order from the lower layer side as described above in <Method for forming semiconductor thin film>.

<Thin-film Semiconductor Device-2>

Figure 6:
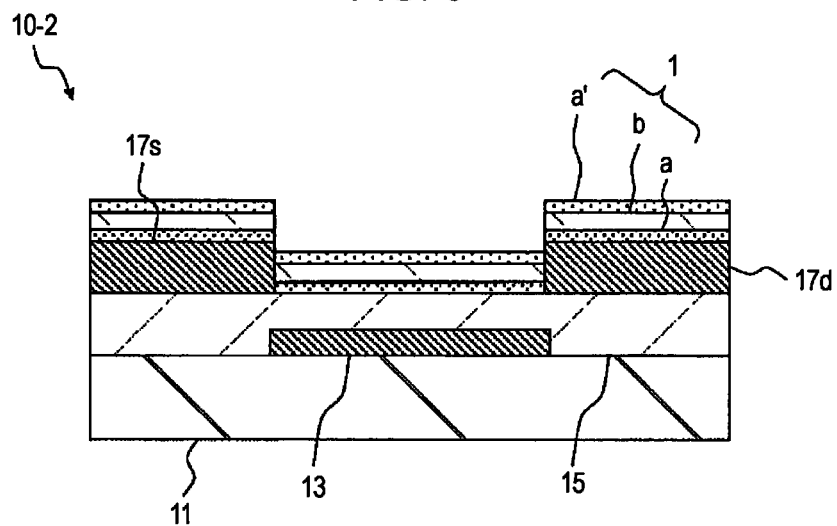
FIG. 6 is a sectional configuration diagram showing a second example of a thin-film semiconductor device obtained by applying the present invention.

FIG. 6 is a sectional configuration diagram showing a second example of a thin-film semiconductor device using a semiconductor thin film formed by applying the present invention. A thin-film semiconductor device 10-2 shown in this figure is also a bottom-contact-bottom-gate (BCBG) type thin-film transistor, and the same component as in the thin-film semiconductor device (10-1) shown in FIG. 2 is denoted by the same reference numeral.

The thin-film semiconductor device 10-2 of the second example shown in this figure is different from the thin-film semiconductor device 10-1 of the first example shown in FIG. 2 in a configuration in which the semiconductor thin film 1 is divided at pattern steps of the source electrode 17s and the drain electrode 17d, and the other configuration is the same as the first example.

Such a configuration assumes a state in which the above-described semiconductor thin film 1 is provided in a state of contact with the gate insulating film 15, the source electrode 17s, and the drain electrode 17d over the source electrode 17s and the drain electrode 71d, and the semiconductor layer a of the three-layer structure semiconductor thin film 1 is provided in a state of contact with the source electrode 17s, the gate insulating film 15, and the drain electrode 17d. However, the semiconductor layer a comes in contact with the source electrode 17s the drain electrode 17d at the end surfaces thereof.

Even in the thin-film semiconductor device 10-2 having the above configuration, like in the first example, decrease in mobility due to heating and characteristic deterioration due to the mobility decrease can be suppressed using as an active layer the semiconductor thin film 1 described using FIG. 1, thereby permitting an attempt to improve heat resistance.

The thin-film semiconductor device 10-2 having the above configuration may be manufactured by forming the coating film 20 having a sufficiently small thickness relative to the thickness of the source electrode 17s and the drain electrode 17d when the coating film 20 is formed to manufacture the thin-film semiconductor device 10-1. As a result, the coating film 20 is divided at the steps of the source electrode 17s and the drain electrode 17d, and thus the semiconductor thin film 1 obtained by phase separation of the coating film 20 is divided by the upper and lower portions of the source electrode 17s and the drain electrode 17d.

<Thin-film Semiconductor Device-3>

Figure 7:
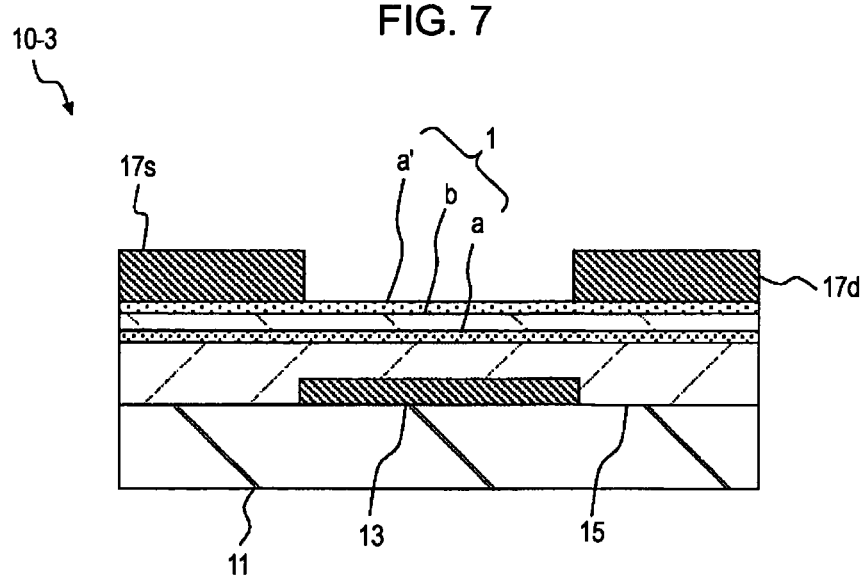
FIG. 7 is a sectional configuration diagram showing a third example of a thin-film semiconductor device obtained by applying the present invention.

FIG. 7 is a sectional configuration diagram showing a third example of a thin-film semiconductor device using a semiconductor thin film formed by applying the present invention. A thin-film semiconductor device 10-3 shown in this figure is a top-contact-bottom-gate (TCBG) type thin-film transistor, and the same component as in the thin-film semiconductor device (10-1) shown in FIG. 4 is denoted by the same reference numeral.

The thin-film semiconductor device 10-3 of the third example shown in this figure is different from the thin-film semiconductor device (10-1) of the first example shown in FIG. 4 in the lamination order of the semiconductor thin film 1, the source electrode 17s, and the drain electrode 17d, and the other configuration is the same as the first example.

That is, the source electrode 17s and the drain electrode 17d are pattern-formed, through the semiconductor thin film 1, on the gate insulating film 15 which covers the gate electrode 13 on the substrate 11. Consequently, the above-described semiconductor thin film 1 is provided in a state of contact with the gate insulating film 15, the source electrode 17s, and the drain electrode 17d over the source electrode 17s and the drain electrode 17d.

In the thin-film semiconductor device 10-3 of the third example, the gate insulating film 15 is in contact with one (here, the semiconductor layer a) of the plurality of semiconductor layers constituting the above-described semiconductor thin film 1, and the source electrode 17s and the drain electrode 17d are provided in a state of contact with the other (here, the semiconductor layer a').

Even in the thin-film semiconductor device 10-3 having the above configuration, like in the first example, decrease in mobility due to heating and characteristic deterioration due to the mobility decrease can be suppressed using the semiconductor thin film 1 described using FIG. 1 as an active layer, thereby permitting an attempt to improve heat resistance.

The thin-film semiconductor device 10-3 having such a configuration may be manufactured according to the procedures including forming the gate insulating film 15 and then forming the semiconductor thin film 1 before forming the source electrode 17s and the drain electrode 17d when the thin-film semiconductor device 10-1 is manufactured.

<Thin-film Semiconductor Device-4>

Figure 8:
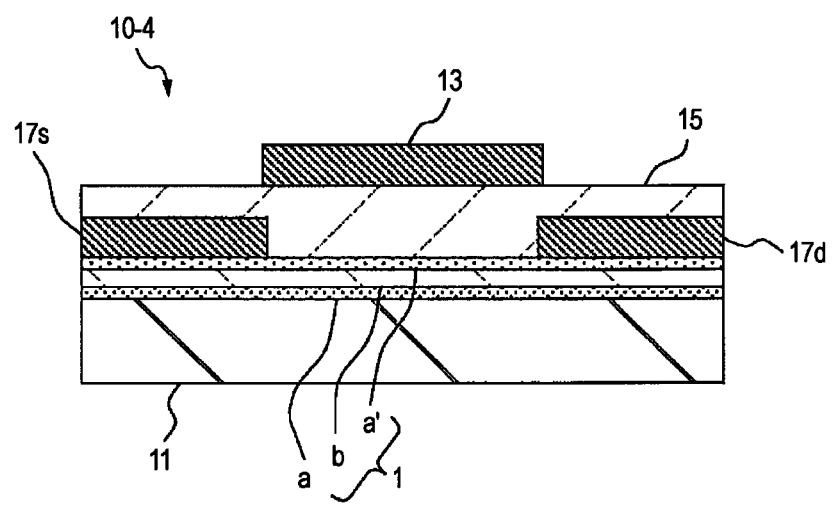
FIG. 8 is a sectional configuration diagram showing a fourth example of a thin-film semiconductor device obtained by applying the present invention.

FIG. 8 is a sectional configuration diagram showing a fourth example of a thin-film semiconductor device using a semiconductor thin film formed by applying the present invention. A thin-film semiconductor device 10-4 shown in this figure is a top-contact-top-gate (TCTG) type thin-film transistor, and the same component as in the thin-film semiconductor device (10-1) shown in FIG. 4 is denoted by the same reference numeral.

The thin-film semiconductor device 10-4 of the fourth example shown in this figure is different from the thin-film semiconductor device (10-1) of the first example shown in FIG. 4 in the lamination order of the components, and the other configuration is the same as the first example.

That is, the source electrode 17s and the drain electrode 17d are pattern-formed on the substrate 11 through the semiconductor thin film 1, and the gate insulating film 15 is provided in a state of covering these electrodes. The gate electrode 13 is pattern-formed on the gate insulating film 15 at a position sandwiched between the source electrode 17s and the drain electrode 17d.

In such a configuration, like in the first example, the above-described semiconductor thin film 1 is provided in a state of contact with the gate insulating film 15, and the source electrode 17s, and the drain electrode 17d over the source electrode 17s and the drain electrode 17d, and the semiconductor layer a' of the three-layer structure semiconductor thin film 1 is provided in a state of contact with the source electrode 17s, the gate insulating film 15, and the drain electrode 17d.

Even in the thin-film semiconductor device 10-4 having such a configuration, like in the first example, decrease in mobility due to heating and characteristic deterioration due to the mobility decrease can be suppressed using as an active layer the semiconductor thin film 1 described using FIG. 1, thereby permitting an attempt to improve heat resistance.

The thin-film semiconductor device 10-4 having such a configuration may be manufactured according to the procedures including forming the semiconductor thin film 1 on the substrate 11, further forming the source electrode 17s and the drain electrode 17d, and then forming the gate insulating film 15 and the gate electrode 13 in that order. Each of the portions may be formed by the same method as in manufacturing the thin-film semiconductor device 10-1.

<Thin-film Semiconductor Device-5>

Figure 9:
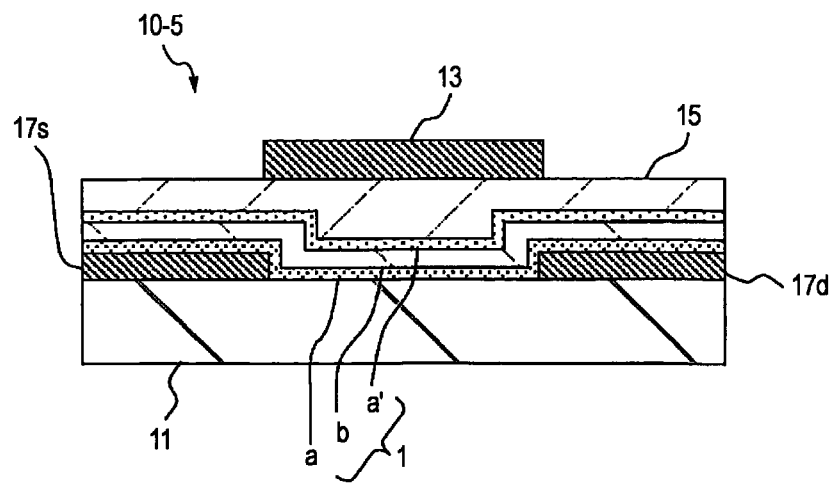
FIG. 9 is a sectional configuration diagram showing a fifth example of a thin-film semiconductor device obtained by applying the present invention.

FIG. 9 is a sectional configuration diagram showing a fifth example of a thin-film semiconductor device using a semiconductor thin film formed by applying the present invention. A thin-film semiconductor device 10-5 shown in this figure is a bottom-contact-top-gate (BCTG) type thin-film transistor, and the same component as in the thin-film semiconductor device (10-1) shown in FIG. 4 and the thin-film semiconductor device (10-4) shown in FIG. 8 is denoted by the same reference numeral.

The thin-film semiconductor device 10-5 of the fifth example shown in this figure is different from the thin-film semiconductor device (10-4) of the fourth example shown in FIG. 8 in the lamination order of the semiconductor thin film 1, the source electrode 17s, and the drain electrode 17d, and the other configuration is the same as the fourth example.

That is, the source electrode 17s and the drain electrode 17d are pattern-formed on the substrate 11, and the semiconductor thin film 1 is provided in a state of covering these electrodes. The gate insulating film 15 is provided on the semiconductor thin film 1, and further the gate electrode 13 is pattern-formed on the gate insulating film 15 at a position sandwiched between the source electrode 17s and the drain electrode 17d.

In the thin-film semiconductor device 10-5 of the fifth example, the gate insulating film 15 is in contact with one (here, the semiconductor layer a') of the plurality of semiconductor layers constituting the above-described semiconductor thin film 1, and the source electrode 17s and the drain electrode 17d are provided in a state of contact with the other (here, the semiconductor layer a).

Even in the thin-film semiconductor device 10-5 having such a configuration, like in the first example, decrease in mobility due to heating and characteristic deterioration due to the mobility decrease can be suppressed using the semiconductor thin film 1 described using FIG. 1 as an active layer, thereby permitting an attempt to improve heat resistance.

The thin-film semiconductor device 10-5 having such a configuration may be manufactured according to the procedures including forming the source electrode 17s and the drain electrode 17d on the substrate 11, further forming the semiconductor thin film 1, and then forming the gate insulating film 15 and the gate electrode 13 in that order. Each of the portions may be formed by the same method as in manufacturing the thin-film semiconductor device 10-1.

<Thin-film Semiconductor Device-6>

Figure 10:
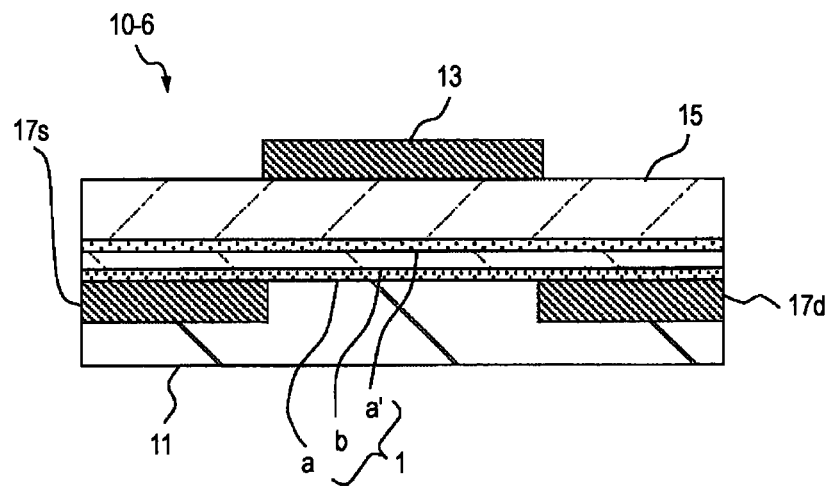
FIG. 10 is a sectional configuration diagram showing a sixth example of a thin-film semiconductor device obtained by applying the present invention.

FIG. 10 is a sectional configuration diagram showing a sixth example of a thin-film semiconductor device using a semiconductor thin film formed by applying the present invention. A thin-film semiconductor device 10-6 shown in this figure is a first modified example of the bottom-contacttop-gate (BCTG) type thin-film transistor of the fifth example, and is different from the fifth example only in that the surfaces of the source electrode 17s and the drain electrode 17d form a plane coplanar with the surface of the substrate 11.

In manufacturing the thin-film semiconductor device 10-6 with such a configuration, procedures may include first forming a groove pattern on the surface side of the substrate 11, and forming the source electrode 17s and the drain electrode 17d to fill the groove pattern. In this case, an electrode material film is formed and then polished to leave the electrode material film only in the groove pattern, thereby filling the groove pattern and forming the source electrode 17s and the drain electrode 17d in the pattern. Then, the semiconductor thin film 1 is formed, and then the gate insulating film 15 and the gate electrode 13 are formed in that order. The formation of these components may be performed by the same method as that for manufacturing the thin-film semiconductor device 10-1.

<Thin-film Semiconductor Device-7>

Figure 11:
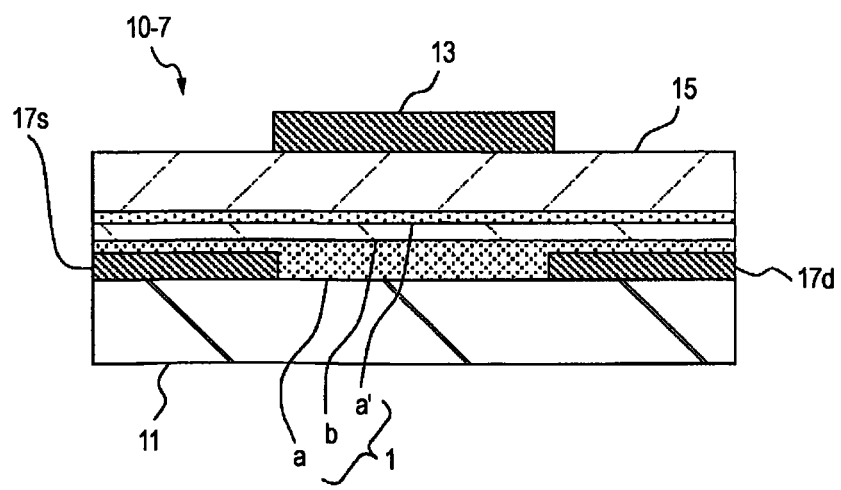
FIG. 11 is a sectional configuration diagram showing a seventh example of a thin-film semiconductor device obtained by applying the present invention.

FIG. 11 is a sectional configuration diagram showing a seventh example of a thin-film semiconductor device using a semiconductor thin film formed by applying the present invention. A thin-film semiconductor device 10-7 shown in this figure is a second modified example of the bottom-contact-top-gate (BCTG) type thin-film transistor of the fifth example, and is different from the fifth example only in that the semiconductor layer a constituting the semiconductor thin film 1 is formed to fill the pattern steps of the source electrode 17s and the drain electrode 17d and have a flat surface.

In addition, the above-described thin-film semiconductor device according to the embodiment is further covered with an interlayer insulating film and a passivation film according to demand and used after wiring.

In manufacturing the thin-film semiconductor device 10-7 with such a configuration, procedures may include first forming the source electrode 17s and the drain electrode 17d on the surface side of the substrate 11. Then, the semiconductor layer a as a first layer is formed to such a thickness as to fill the pattern steps of the source electrode 17s and the drain electrode 17d. Next, the intermediate layer b and the semiconductor layer a' are formed as upper layers to form the semiconductor thin film 1. Next, the gate insulating film 15 and the gate electrode 13 are formed in that order. The formation of these components may be performed by the same method as that for manufacturing the thin-film semiconductor device 10-1.

<Display Device>

Next, description is made of an active matrix-type display device using organic electroluminescent element EL is described as an example of a display device using a thin-film semiconductor device obtained by applying the manufacturing method of the present invention described in the above-described embodiment.

Figure 12:
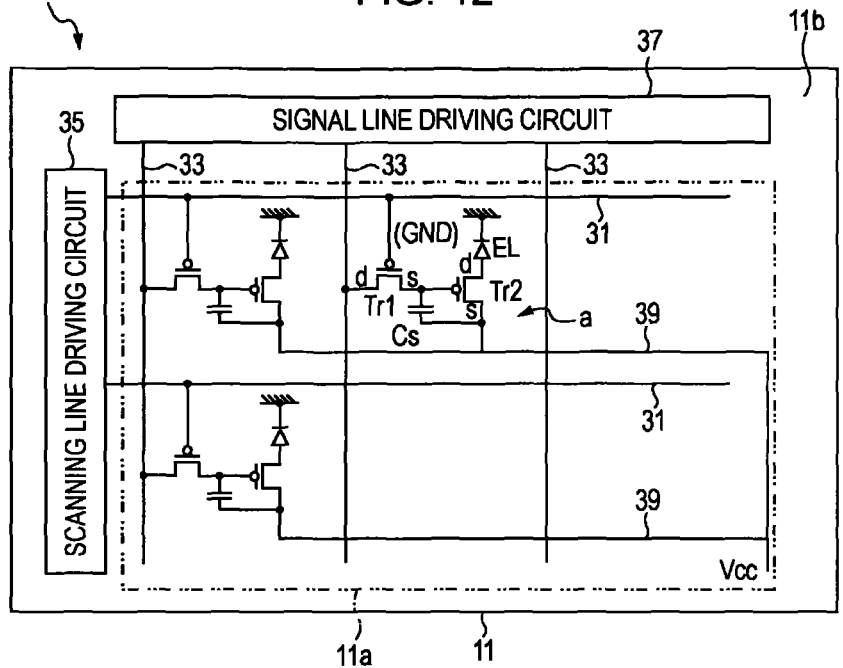
FIG. 12 is a circuit block diagram of a display device according to an embodiment.

FIG. 12 is a circuit block diagram of a display device 30.

As shown in this figure, a display region 11a and a peripheral region 11b are set on a substrate 11 of the display device 30. In the display region 11a, a plurality of scanning lines 31 and a plurality of signal lines 33 are arranged in a matrix form to form a pixel array portion in which a pixel a is provided corresponding to each of the intersections of the scanning and signal lines. In addition, in the peripheral region 11b, a scanning line driving circuit 35 which drives the scanning lines 31 and a signal line driving circuit 37 which supplies video signals (i.e., input signals) to the signal lines 33 according to luminance information are disposed.

A pixel circuit provided at each of the intersections of the scanning lines 31 and the signal lines 33 is composed of, for example, a thin-film transistor Tr1 for switching, a thin-film transistor Tr2 for driving, a storage capacitor Cs, and an organic luminescence element EL. In addition, the above-described thin-film transistors 10-1 to 10-7 are used as the thin-film transistors Tr1 and Tr2.

Further, a video signal written from the corresponding signal line 33 through the thin-film transistor Tr1 for switching by driving by the scanning line driving circuit 35 is stored in the storage capacitor Cs, and a current corresponding to the amount of the stored signal is supplied to the organic electroluminescence element EL from the thin-film transistor Tr2 for driving, resulting in emission of light from the organic electroluminescence element EL with luminance corresponding to the current value. In addition, the thin-film transistor Tr2 for driving is connected to a common power supply line (Vcc) 39.

In addition, the above-described pixel circuit configuration is merely an example, and, according to demand, a capacitor element may be provided in the pixel circuit or the pixel circuit may be configured by providing a plurality of transistors. In addition, a driving circuit required according to change of the pixel circuit is added to the peripheral region 11b.

Figure 13:
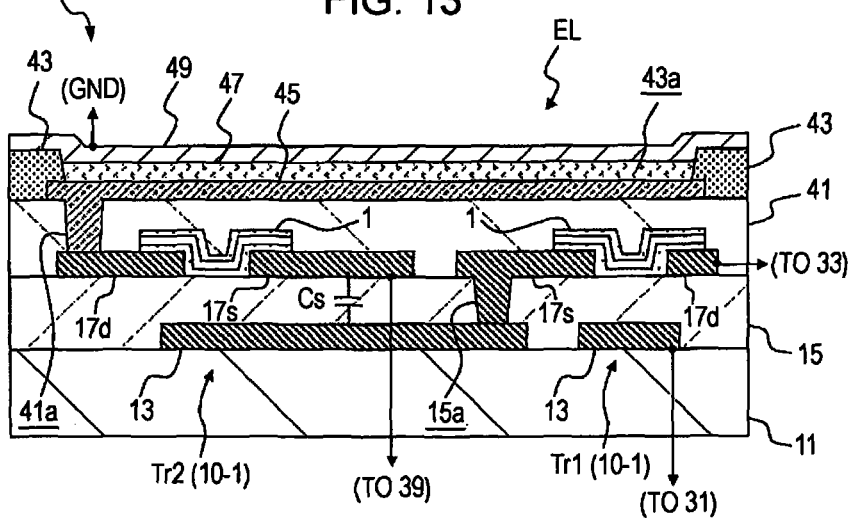
FIG. 13 is a sectional view showing an example of a display device as an electronic apparatus according to an embodiment.

As a sectional view of one pixel in the display device 30 having the above-described circuit configuration, FIG. 13 is a sectional view showing a portion in which the thin-film transistors Tr2 and Tr1, the capacitor element Cs, and the organic electroluminescence element EL are laminated.

As shown in this figure, for example, the bottom-contact-bottom-gate structure thin-film transistor (10-1) shown in FIG. 4 is provided as each of the thin-film transistors Tr2 and Tr1 in each pixel.

The source electrode 17s of the thin-film transistor Tr1 is connected to the gate electrode 13 of the thin-film transistor Tr2 through a connection hole 15a provided in the gate insulating film 15. In addition, the gate insulating film 15 is sandwiched between an extending portion of the gate electrode 13 and an extending portion of the source electrode 17s of the thin-film transistor Tr2 to form the capacitor element Cs. In addition, as shown in the circuit diagram of FIG. 12, the gate electrode 13 of the thin-film transistor Tr1, the drain electrode 17d of the thin-film transistor Tr1, and the source electrode 17s of the thin-film transistor Tr2 are extended to the scanning line 31, the signal line 33, and the power supply line 39, respectively.

The above-described thin-film transistors Tr1 and Tr2 and capacitor element Cs are covered with an interlayer insulating film 41 through, for example, a protective film. The interlayer insulating film 41 is preferably configured as a planarization film. A connection hole 41a is provided in the interlayer insulating film 41 so as to reach the drain electrode 17d of the thin-film transistor Tr2.

In addition, the organic electroluminescence element EL is provided in each pixel on the interlayer insulating film 41 so as to be connected to the thin-film transistor Tr2 through the connection hole 41a. The organic electroluminescence element EL is separated by an insulating pattern 43 provided on the interlayer insulating film 41.

The organic electroluminescence element EL includes a pixel electrode 45 provided on the interlayer insulating film 41. The pixel electrode 45 is formed as a conductive pattern for each pixel and is connected to the drain electrode 17d of the thin-film transistor Tr2 through the connection hole 41a provided in the interlayer insulating film 41. This pixel electrode 45 is used as, for example, as an anode, and is configured to have light reflectivity.

In addition, the periphery of the pixel electrode 45 is covered with the insulating pattern 43 for separating the organic electroluminescence element EL. The insulating pattern 43 is provided with an opening window 43a which widely exposes the pixel electrode 45 so that the opening window 43a serves as a pixel aperture of the organic electroluminescence element EL. The insulating pattern 43 is configured by applying a lithographic method for patterning using, for example, a photosensitive resin.

In addition, an organic layer 47 is provided in a state of covering the pixel electrode 45 exposed from the insulating pattern 43. The organic layer 47 has a layered structure including at least an organic light-emitting layer, and is formed by laminating a hole injection layer, a hole transport layer, the organic light-emitting layer, an electron transport layer, an electron injection layer, and another layer in that order from the anode (here, the pixel electrode 45) side according to demand. In addition, the organic layer 47 is pattern-formed for the wavelength of light emitted in each of the organic electroluminescence elements so that layers including at least the organic light-emitting layer have different configurations for respective pixels. Also, the pixels with respective wavelengths may have a common layer. Further, when the organic electroluminescence elements EL are configured as micro resonator structures, the thickness of the organic layer 47 is adjusted according to the wavelength extracted from each of the organic electroluminescence elements EL.

A common electrode 49 is provided in a state of covering the above-described organic layer 47 and sandwiching the organic layer 47 between the pixel electrode 45 and the common electrode 49. The common electrode 49 is an electrode on the side where the light emitted in the organic light-emitting layer of the organic electroluminescence element EL is extracted, and is composed of a material having light transmissivity. Here, also, the pixel electrode 45 functions as an anode, and thus the common electrode 49 is configured using a material functioning as a cathode at least on the side in contact with the organic layer 47. Further, when the organic electroluminescence elements EL are configured as micro resonator structures, the common electrode 49 is configured to have semi-transmissivity/semi-reflectivity. In addition, as shown in the circuit diagram of FIG. 12, the common electrode 49 is set at GND.

In addition, each pixel portion in which the organic layer 47 is sandwiched between the above-described pixel electrode 45 and common electrode 49 serves as a portion functioning as the organic electroluminescence element EL.

Also, although not shown in the figure, the display device 30 is configured in a state in which the side where each organic electroluminescence element EL is formed is covered with a sealing resin composed of a light transmitting material, and a counter substrate composed of a light-transmitting material is bonded through the sealing resin.

In the display device 30 configured as described above, the pixel circuit is configured using the thin-film transistor (10-1) having good transistor characteristics, and thus the pixel electrode can be stably driven, thereby permitting an attempt to improve display characteristics.

In addition, the display device using the bottom-contact-bottom-gate structure thin-film transistor 10-1 described using FIG. 4 is described in the above embodiment. However, the above-described display device may use any one of the above-described thin-film transistors 10-2 to 10-7 in place of the thin-film transistor 10-1, and the same advantage can be obtained. Further, in the above embodiment, the active matrix-type display device using the organic electroluminescence EL is exemplified as an example of a display device provided with a thin-film transistor. However, the display device of the present invention can be widely applied to display devices provided with thin-film transistors and can be applied to, for example, liquid crystal displays and electrophoretic displays.

<Electronic Apparatus>

An electronic apparatus according to an embodiment of the present invention can be widely applied to electronic apparatuses each provided with any one of the above-described thin-film transistors 10-1 to 10-7, a conductive pattern being connected to the thin-film transistor. For example, the electronic apparatus can be applied to electronic apparatuses such as ID tags, sensors, and the like, and the same advantage can be obtained. Also, an electronic apparatus according to an embodiment of the present invention can be widely applied to electronic apparatuses each provided with the above-described display device. The electronic apparatus can be applied to electronic apparatuses provided with display devices in any field in which a video signal input to an electronic apparatus or a video signal generated in an electronic apparatus is displayed as an image or a picture, for example, an electronic paper, a digital camera, a notebook-size personal computer, a portable terminal device such as a cellular phone, a video camera, and the like.

EXAMPLES

Preparation of Semiconductor Thin Film-1

Poly(Alpha-Methylstyrene)

TIPS pentacene was used as an organic semiconductor material, poly(alpha-methylstyrene) (PaMS) was used a different organic material, and these materials were mixed and dissolved in mesitylene to prepare a solution. In addition, the TIPS pentacene was used as a conjugated low-molecular organic semiconductor material. Also, the PaMS was used as a high-molecular insulating material.

Here, as the PaMS which was a high-molecular insulating material, PaMS having each of the molecular weights shown in <Samples 1 to 5> of Table 1 below was used, and the solution was prepared at a mixing ratio of TIPS pentacene: PaMS=1:1.

TABLE 1

| | Molecular weight of PaMS | | |
| --- | --- | --- | --- |
| | Mn | Mw | Mw/Mn |
| <Sample 1> | 1960 | 2200 | 1.12 |
| <Sample 2> | 27600 | 28200 | 1.02 |
| <Sample 3> | 58000 | 59100 | 1.02 |
| <Sample 4> | 106000 | 108000 | 1.02 |
| <Sample 5> | 807000 | 868000 | 1.08 |

Also, as shown in Table 1, PaMS having a narrow molecular weight distribution was used, in which the values of number-average molecular weight (Mn) and weight-average molecular weight (Mw) were close to each other, and the weight-average molecular weight (Mw)/number-average molecular weight (Mn) was about 1.

Next, the prepared solution was applied by spin coating on a substrate configured to have a surface including an organic insulating film composed of crosslinked PVP (polyvinylphenol) as a main component to form a coating film. The formed coating film was dried at 60° C. for 1 hour in a nitrogen atmosphere to obtain a semiconductor thin film.

<Mobility>

Figure 14:
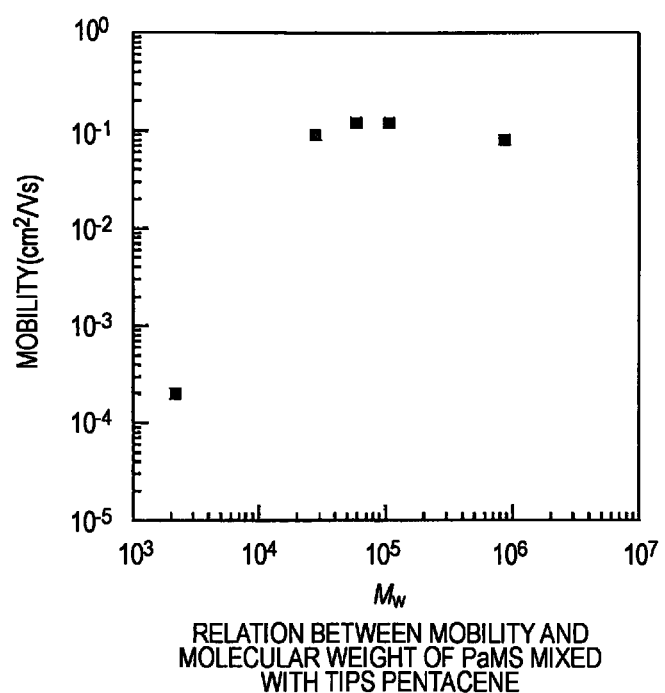
FIG. 14 is a graph showing a relation between the molecular weight of PaMS and mobility measured for the resulting semiconductor thin films.

Mobility was measured for each of the resulting semiconductor thin films. FIG. 14 shows a relation between the molecular weight (Mw) of PaMS and mobility measured for the resulting semiconductor thin film. As shown by a graph of FIG. 14, the higher the molecular weight of the high molecule (PaMS) used, the higher the mobility. This sufficiently agrees with the result that the mixing Gibbs energy (ΔGm) increases as the molecular weight of high molecule (PaMS) increases as described using FIG. 2. In addition, it was confirmed from FIG. 14 that a semiconductor thin film with sufficiently high mobility can be obtained by mixing high molecule (PaMS) having a molecular weight of 5,000 or more, preferably 20,000 or more, with a semiconductor material.

<Concentration Profile>

A concentration profile in the thickness direction was measured by TOF-SIMS for each of the resulting semiconductor thin films. The results are shown in FIG. 15. In addition, in FIG. 15, CN and O are components of the organic insulating film constituting the surface of the substrate.

FIG. 15(1) shows a concentration profile of the semiconductor thin film of <Sample 4> prepared using PaMS (Mw=108,000, Mn=106,000) having a molecular weight of 20,000 or more. As shown in this figure, peaks of Si contained in TIPS pentacene were detected at two separate positions including a position near the surface and a position near the interface with the insulating layer (substrate). This confirmed that in the process of drying the above-described coating solution, TIPS pentacene as the organic semiconductor material and PaMS as the organic insulating material undergo phase separation to obtain a semiconductor thin film 1 having a layered structure in which an intermediate layer b composed of PaMS as a main component was sandwiched between semiconductor layers a and a' composed of TIPS pentacene containing Si as shown in FIG. 1.

On the other hand, FIG. 15(2) shows a concentration profile of the semiconductor thin film of <Sample 1> prepared using PaMS (Mw=2,200, Mn=1,960) having a molecular weight of 20,000 or less. As shown in this figure, Si contained in TIPS pentacene is slightly localized on the surface, but is detected substantially uniformly on the surface side of the insulating layer (substrate) in which CN and O are detected at high concentrations. This confirmed that in the semiconductor thin film of <Sample 1>, TIPS pentacene as the organic semiconductor material and PaMS as the organic insulating material do not undergo phase separation in the process of drying the above-described coating solution, thereby obtaining only a single-layer structure thin film in which the components are substantially uniformly mixed in the thin film.

<X-Ray Diffraction Spectrum>

An X-ray diffraction spectrum was measured for each of the resulting semiconductor thin films. The results are shown in FIG. 16.

Figure 16:
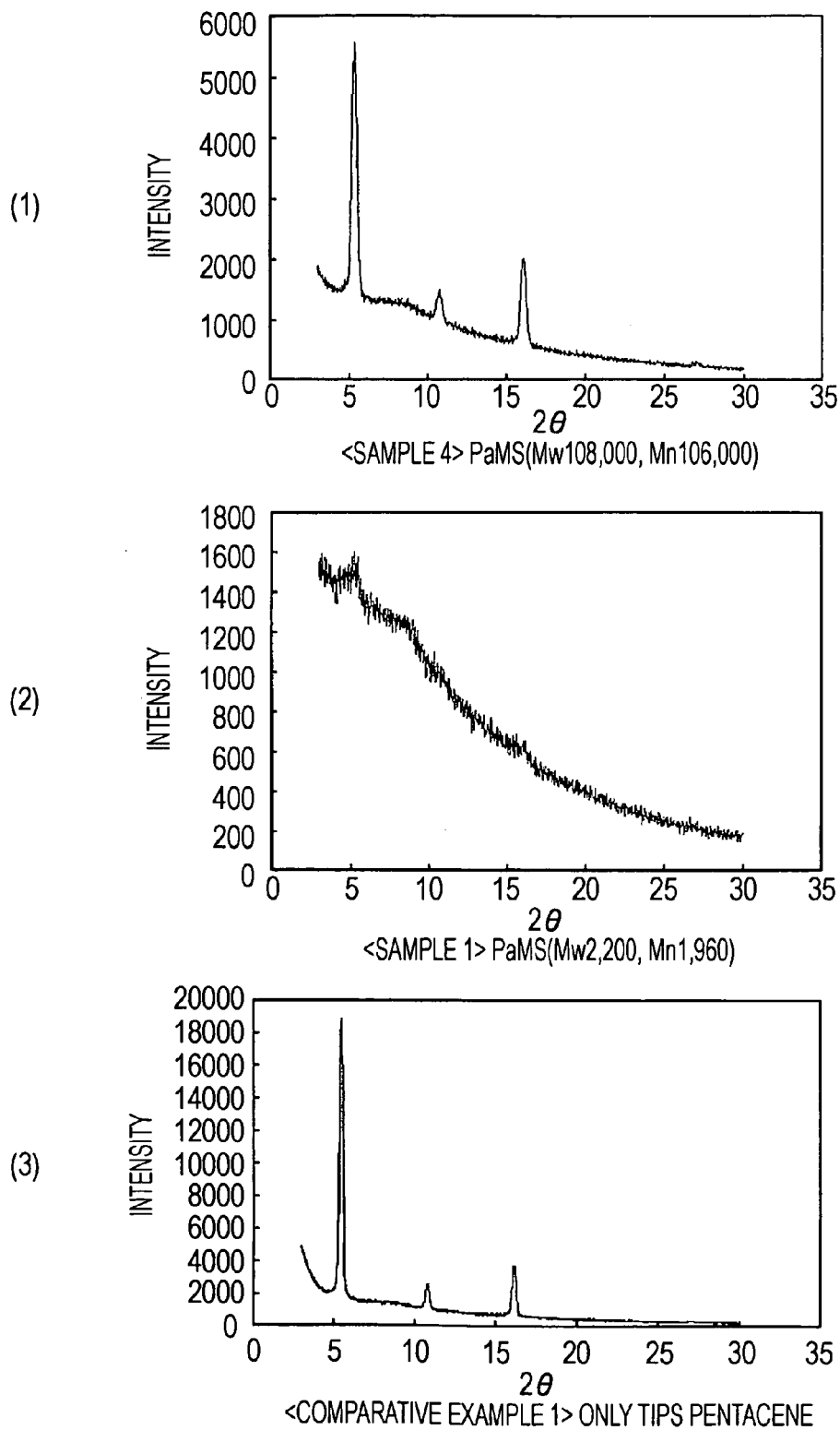
FIG. 16 is an XRD spectrum of a semiconductor thin film of each of samples 1 and 4 prepared using PaMS having respective molecular weights and a semiconductor thin film of Comparative Example 1 prepared using only TIPS pentacene.

FIG. 16(1) shows a spectrum of the semiconductor thin film of <Sample 4> prepared using PaMS (Mw=108,000, Mn=106,000) having a molecular weight of 20,000 or more. FIG. 16(2) shows an X-ray diffraction spectrum of the semiconductor thin film of <Sample 1> prepared using PaMS (Mw=2,200, Mn=1,960) having a molecular weight of 5,000 or less.

In addition, FIG. 16(3) shows a spectrum of the semiconductor thin film formed as <Comparative Example 1> according to the same procedures using a solution prepared by dissolving only TIPS pentacene (organic semiconductor material) in mesitylene without using an organic insulating material.

As shown in FIG. 16(1), the semiconductor thin film of <Sample 4> undergoing phase separation of TIPS pentacene as the organic semiconductor material and PaMS as the organic insulating material shows the same diffraction spectrum as that of <Comparative Example 1> with a single-layer structure composed of only TIPS pentacene shown in FIG. 16(3). This confirmed that in the semiconductor thin film of <Sample 4> undergoing phase separation, the arrangement state of TIPS pentacene in the semiconductor layers a and a' is kept in the same as in a single-layer structure composed of TIPS pentacene and formed as Comparative Example 1.

In contrast, as shown in FIG. 16(2), no peak occurs in an X-ray diffraction spectrum of the semiconductor thin film of <Sample 1> with a single-layer structure in which TIPS pentacene and PaMS are substantially uniformly mixed, and it is found that TIPS pentacene cannot be oriented in the thin film, thereby causing a disordered molecular arrangement.

In addition, apart from the above-described <Samples 1 to 4>, the same film was formed using PaMS (Mn=500, Mw=15,000) having a large difference between number-average molecular weight (Mn) and weight-average molecular weight (Mw), i.e., PaMS having a wide molecular weight distribution. Measurement of mobility of the resulting film showed extremely small mobility. It was found to be preferred from this result that molecules having a molecular weight of 2,000 or less are absent from the high-molecular material used.

Preparation of Semiconductor Thin Film-2

Polystyrene

TIPS pentacene was used as an organic semiconductor material, polystyrene (PS) was used a different organic material, and these materials were mixed and dissolved in mesitylene to prepare a solution. In addition, the TIPS pentacene was used as a conjugated low-molecular organic semiconductor material. Also, the PS was used as a high-molecular insulating material.

Here, as the PS which was a high-molecular insulating material, PS having each of the molecular weights shown in <Samples 6 to 11> of Table 2 below was used, and the solution was prepared at a mixing ratio by weight of TIPS pentacene:PS=1:1.

TABLE 2

| | Molecular weight of PS | | |
|---|---|---|---|
| | Mn | Mw | Mw/Mn |
| <Sample 6> | 4110 | 4100 | 1.00 |
| <Sample 7> | 23300 | 23800 | 1.02 |
| <Sample 8> | 92000 | 96000 | 1.04 |
| <Sample 9> | 305000 | 319000 | 1.05 |
| <Sample 10> | 497000 | 532000 | 1.07 |
| <Sample 11> | 970800 | 1103000 | 1.14 |

Also, as shown in Table 2, PS having a narrow molecular weight distribution was used, in which the values of number-average molecular weight (Mn) and weight-average molecular weight (Mw) were close to each other, and the weight-average molecular weight (Mw)/number-average molecular weight (Mn) was about 1.

Next, the prepared solution was applied by spin coating on a substrate configured to have a surface including an organic insulating film composed of crosslinked PVP (polyvinylphenol) as a main component to form a coating film. The formed coating film was dried at 60° C. for 1 hour in a nitrogen atmosphere to obtain a semiconductor thin film.

<Mobility>

Figure 17:
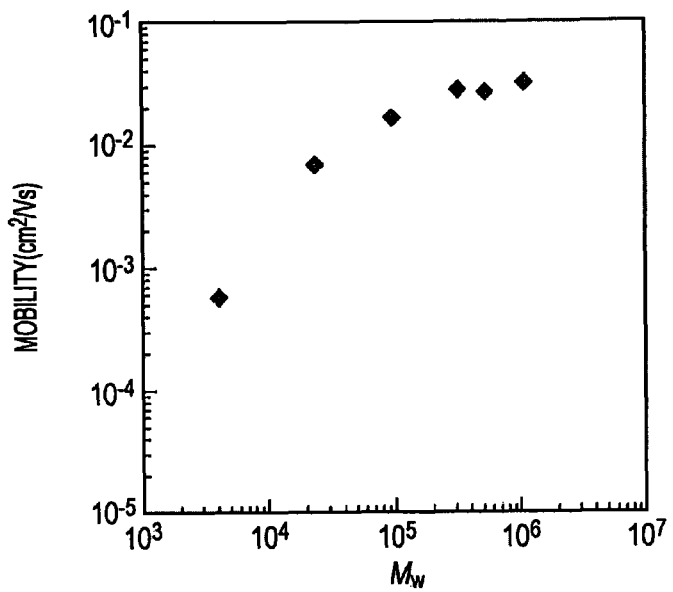
FIG. 17 is a graph showing a relation between the molecular weight of PS and mobility measured for the resulting semiconductor thin film.

Mobility was measured for each of the resulting semiconductor thin films. FIG. 17 shows a relation between the molecular weight (Mw) of PS and mobility measured for the resulting semiconductor thin film. As shown in a graph of FIG. 17, the higher the molecular weight of the high molecule (PS) used, the higher the mobility. This well agrees with the result that the mixing Gibbs energy (ΔGm) increases as the molecular weight of high molecule (PS) increases as described using FIG. 2. In addition, it was confirmed from FIG. 17 that a semiconductor thin film with sufficiently high mobility can be obtained by mixing a high molecule (PS) having a molecular weight of 5,000 or more, preferably 20,000 or more, with a semiconductor material.

Preparation of Semiconductor Thin Film-3

Cyclic Olefin Copolymer

The semiconductor thin film shown in FIG. 1 was formed as follows: First, TIPS pentacene (organic semiconductor material) and a cyclic olefin copolymer (organic insulating material) were mixed and dissolved in mesitylene to prepare a solution. The mixing ratio by weight was 1:1. Next, the prepared solution was applied by spin coating on a substrate having an organic insulating film composed of crosslinked PVP (polyvinylphenol) as a main component to form a coating film. The formed coating film was dried at 60° C. for 1 hour in a nitrogen atmosphere to obtain a thin film.

<Concentration Profile>

Figure 18:
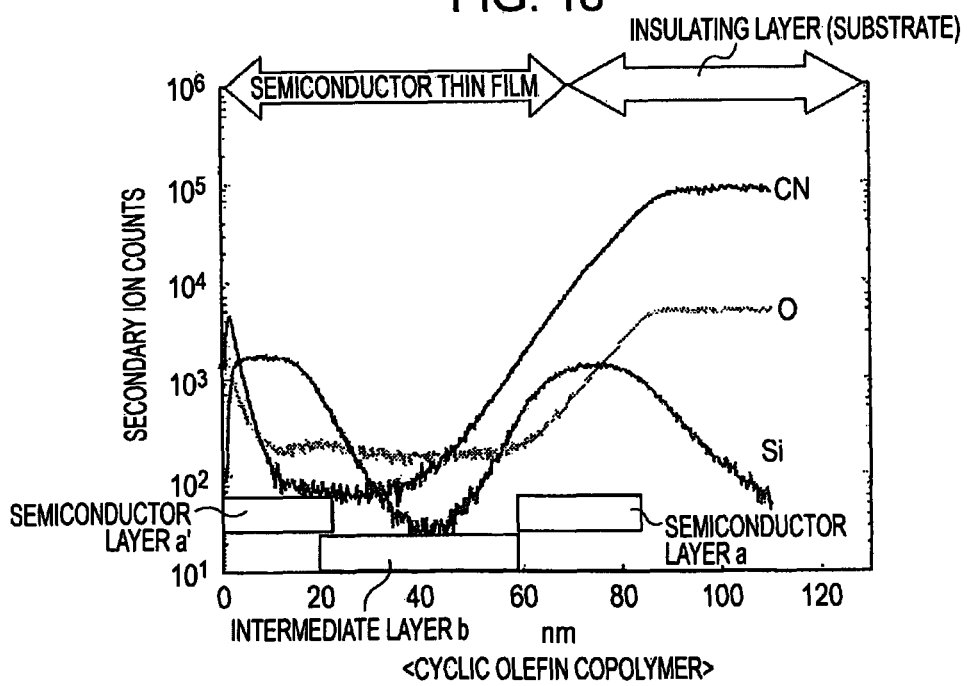
FIG. 18 is a SIMS profile of a semiconductor thin film prepared using a cyclic olefin copolymer.

A concentration profile in the thickness direction was measure by TOF-SIMS for the resulting thin film. The results are shown in FIG. 18. As shown in this figure, peaks of Si contained in TIPS pentacene were detected at two separate positions including a position near the surface and a position near the interface with the insulating layer (substrate). This confirmed that in the process of drying the above-described coating solution, TIPS pentacene as the organic semiconductor material and the cyclic olefin copolymer as the organic insulating material undergo phase separation to obtain a semiconductor thin film 1 having a layered structure in which an intermediate layer b composed of the cyclic olefin copolymer is sandwiched between semiconductor layers a and a' composed of TIPS pentacene containing Si as shown in FIG. 1.

Also, it was confirmed from comparison with the above-described semiconductor thin film obtained using PaMS that phase separation between an organic semiconductor material and an organic insulating material in a coating film is not limited to a case in which an aromatic hydrocarbon compound such as PaMS is used as the organic insulating material, and the phase separation occurs with an olefinic high-molecular material not having an aromatic ring.

Preparation of Film of Comparative Example 2

Polyisobutyl Methacrylate

A film of <Comparative Example 2> was formed as follows: First, TIPS pentacene as a low-molecular organic semiconductor material and polyisobutyl methacrylate (Mw=300,000, Mn=140,000) as a high-molecular insulating material were mixed and dissolved in mesitylene to prepare a solution. The mixing ratio by weight was 1:1. Next, the prepared solution was applied by spin coating on a substrate having an organic insulating film composed of crosslinked PVP (polyvinylphenol) as a main component to form a coating film. The formed coating film was dried at 60° C. for 1 hour in a nitrogen atmosphere to obtain a film of <Comparative Example 2>.

<Concentration Profile>

Figure 19:
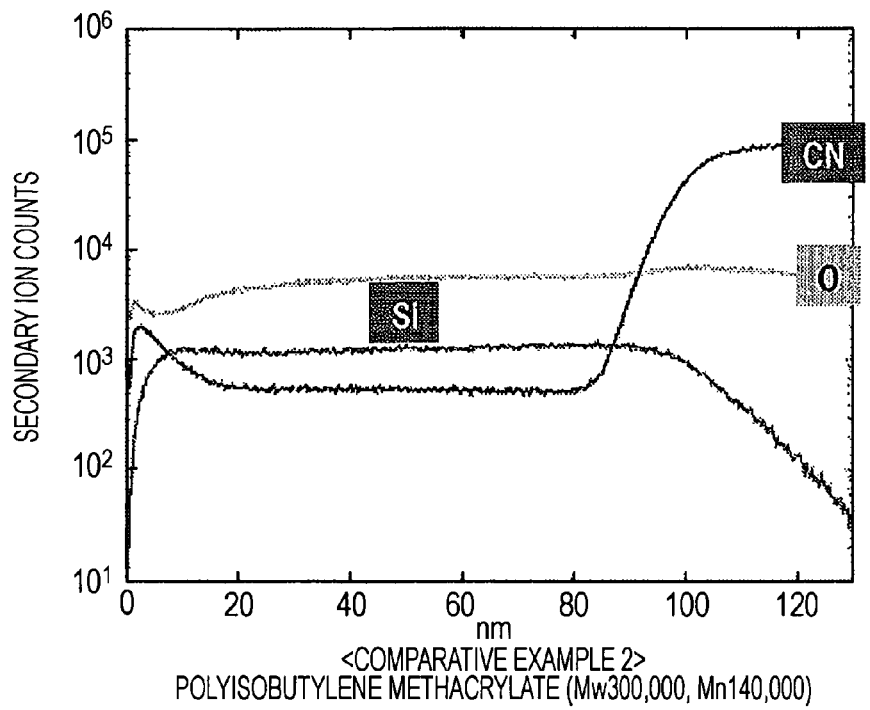
FIG. 19 is a SIMS profile of a comparative film prepared using polyisobutyl methacrylate.

A concentration profile in the thickness direction was measured by TOF-SIMS for the resulting comparative film. The results are shown in FIG. 19. As shown in this figure, peaks of Si contained in TIPS pentacene were detected substantially uniformly on the surface side of the insulating layer (substrate) in which CN and O were detected at high concentrations. This confirmed that, in the process of drying the above-described coating solution, the film of <Comparative Example 2> formed here does not produce phase separation between TIPS pentacene as the organic semiconductor material and polyisobutyl methacrylate as the organic insulating material, thereby forming a single-layer structure.

It is determined by the Flory-Huggins theory that mixing Gibbs energy (ΔGm) of this system is ΔGm<0. That is, mixing is energetically more favorable than phase separation, and thus, unlike in use of PaMS or the like, phase separation does not occur. Therefore, it is considered that TIPS pentacene as semiconductor molecules is not oriented, and sufficient mobility cannot be obtained. In actual X-ray diffraction analysis, a diffraction pattern like that in orientation of TIPS pentacene was not obtained.

Preparation of Thin-film Semiconductor Device

A bottom-contact-bottom-gate (BCBG) type thin-film transistor described using FIG. 4 was formed as described below by applying the formation of each of the semiconductor thin films of <Sample 1> and <Sample 4> using PaMS having the respective molecular weights.

First, a 3-inch Si wafer was used as a common gate electrode 13, a gate insulating film 15 including an organic insulating film was formed on the gate electrode 13, and 87 or more patterns of a source electrode 17s and a drain electrode 17d were formed on the gate insulating film 15. Next, each of the abode-described semiconductor thin film of Sample 1 and semiconductor thin film of Sample 4 was formed on the gate insulating film 15 on which the source electrode 17s and the drain electrode 17d were formed. As a result, a bottom-contact-bottom-gate type thin-film transistor shown in FIG. 4 was obtained.

<Evaluation of Device-1>

Figure 20:
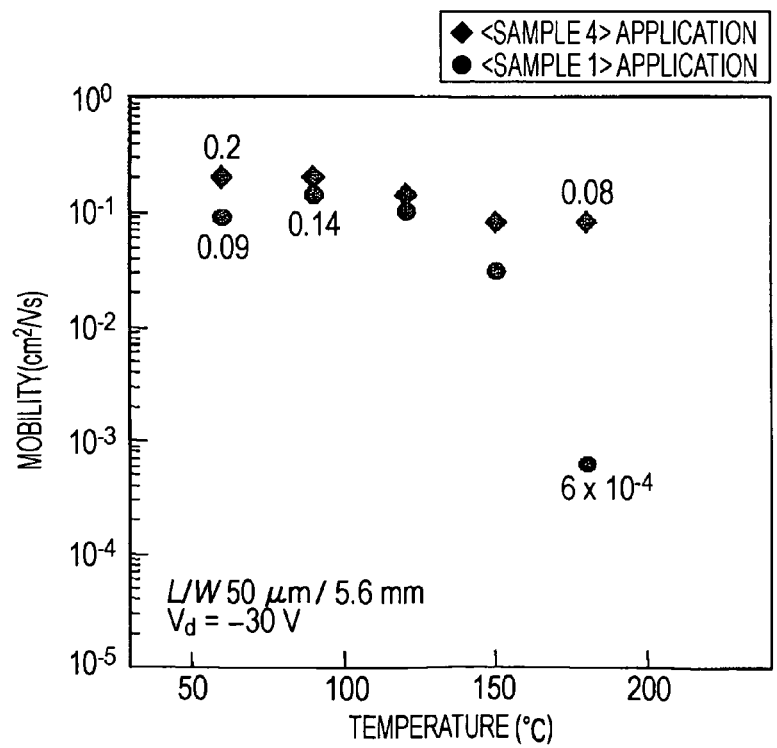
FIG. 20 is a graph showing changes in mobility with the heating temperature of a thin-film transistor prepared by applying each of samples 1 and 4.

Changes of mobility with a heating temperature in a nitrogen atmosphere were measured for the above-described thin-film transistors formed as in <Sample 1> and <Sample 4>. The results are shown in FIG. 20. As shown in this figure, in the thin-film transistor obtained as in <Sample 4>, the initial mobility of 0.2 cm$^2$/Vs is decreased by heating but is maintained at about 0.08 cm$^2$/Vs even by heating to 180° C. In contrast, in the thin-film transistor obtain as in <Sample 1>, the initial mobility of 0.09 cm$^2$/Vs is decreased by heating and is decreased to about 6×10$^{-4}$ cm$^2$/Vs at 180° C.

Therefore, it is found that in the thin-film transistor obtain by applying the present invention as in <Sample 4>, the initial mobility is high and decrease of mobility is suppressed to a low degree even in a state of heating to 180° C. as compared with the thin-film transistor obtain as in <Sample 1>.

Therefore, it was confirmed that when the semiconductor thin film 1 is formed in a layered structure by applying the present invention, it is possible to obtain a semiconductor thin film and a thin-film semiconductor device in which decrease in mobility due to heating and characteristic deterioration due to the mobility decrease can be suppressed, thereby improving heat resistance.

In addition, a conceivable factor of such suppression of mobility deterioration is that expansion of the semiconductor thin film by heating is suppressed by a layered structure. Namely, as one of the physical changes caused by applying heat, expansion/construction by heating is considered. The thin-film transistor can be considered to have a structure in which different organic materials are laminated, and the layers have different thermal expansion coefficients, thereby causing the possibility that stress occurs between the layers when heat is applied. For example, it is known that a laminate of metal Ma and metal Mb having different thermal expansion coefficients is flat at room temperature but is curved at a high temperature. This is a phenomenon which is caused by a difference between the expansion coefficients of upper and lower layers. However, this curvature may be avoided by a sandwich structure of Ma-Mb-Ma. This is possibly due to the fact that although stress occurs due to thermal expansion between metals Ma and Mb, the stress due to thermal expansion between upper and lower layers is decreased by a sandwich structure when the structure is considered as one plate.

Also, when a semiconductor thin film is formed by coating, it is known that the characteristic performance of a thin-film transistor greatly depends on the solvent drying step. For example, it has been reported that a thin-film transistor having high mobility can be obtained using a coating solvent having a higher boiling point (refer to "Chem. Mater.", 16(23), 2004, p. 4772-4776). This is possibly due to the fact that use of a coating solvent with a higher boiling point decreases the drying rate of the coating solvent in the drying step.

In addition, it has been confirmed by visual observation that when the same coating solvent (mesitylene) is used for forming semiconductor thin films as in the above-described <Sample 1> and <Sample 4>, the drying rate of the coating solvent is decreased in the drying step of the coating film of <Sample 4>. This is possibly due to the fact that evaporation the coating solvent is inhibited by mixing poly(α-methylstyrene (Mw=108,000, Mn=106,000) as a high-molecular material having a sufficiently higher molecular weight than that of TIPS pentacene (organic semiconductor material) which is an organic semiconductor material, resulting in decrease in the drying rate. Also, it is thought that such a decrease in the drying rate contributes to the formation of a thin-film transistor having higher mobility.

<Evaluation of Device-2>

Variation of on-current was measured using 87 thin-film transistors of a plurality of the above-described thin-film transistors formed as in each of <Sample 1> and <Sample 4>. As a result, the variation of on-current of the thin-film transistors formed as in <Sample 4> was 11.3%. On the other hand, the variation of on-current of the thin-film transistors formed as in <Sample 1> was 54.7%.

Therefore, in forming a semiconductor thin film by applying a spin coating method, the effect of suppressing variation of the on-current to about ⅕ of that of a case in which a semiconductor thin film is formed using a single organic semiconductor material was confirmed by forming the semiconductor thin film with a layered structure by spontaneous phase separation.

<Evaluation of Device-3>

Figure 21:
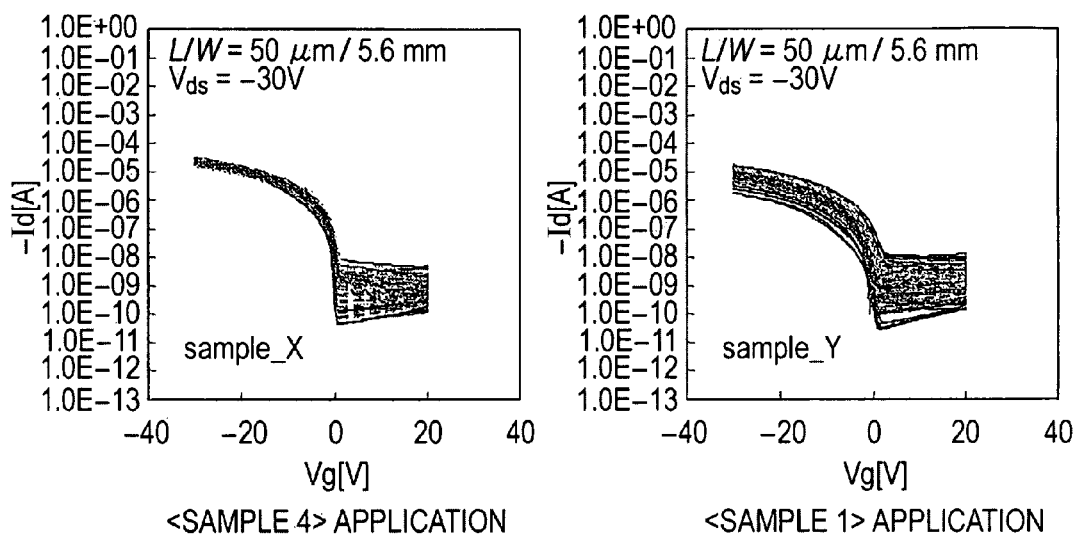
FIG. 21 is a graph showing gate voltage Vg-drain current Id characteristics of a thin-film transistor prepared by applying each of samples 1 and 4.

Gate voltage Vg-drain current Id characteristics were measured using 87 thin-film transistors of a plurality of the above-described thin-film transistors formed as in each of <Sample 1> and <Sample 4>. The results are shown in FIG. 21. The results confirmed that characteristic variation of the thin-film transistors formed as in <Sample 4> is smaller than that of the thin-film transistors formed as in <Sample 1>.

The results of the above-described <Evaluation of device-2> and <Evaluation of device-3> confirmed that by mixing poly(α-methylstyrene) (Mw=108,000, Mn=106,000) which is a high-molecular material having a sufficiently higher molecular weight than that of TIPS pentacene (organic semiconductor material) which is an organic semiconductor material, a certain degree of viscosity can be imparted to the coating solution to improve coatability, and further aggregation in the step of drying the coating film is prevented to form a semiconductor thin film having in-plane uniformity.

The invention claimed is:

1. A method for forming a semiconductor thin film, the method comprising:
    forming the semiconductor thin film by applying or printing, on a substrate, a solution prepared by mixing a plurality of types of organic materials including an organic semiconductor material; and
    phase-separating the plurality of types of organic materials in a process for drying the semiconductor thin film to form a layered structure semiconductor thin film including a semiconductor layer composed of the organic semiconductor material, thereby forming a semiconductor thin film including at least two semiconductor layers by the phase separating, wherein phase-separating the plurality of types of organic materials comprises adjusting the molecular weight of a high-molecular material of the organic materials,
    wherein a mixing Gibbs energy of the plurality of types of organic materials has a positive value.

2. The method for forming the semiconductor thin film according to claim 1, wherein the plurality of types of organic materials comprises an organic insulating material is used.

3. The method for forming the semiconductor thin film according to claim 2, wherein the phase-separating comprises forming the semiconductor thin film including an intermediate layer, the intermediate layer comprising the organic insulating material and being sandwiched between the two semiconductor layers.

4. The method for forming the semiconductor thin film according to claim 1, wherein a same semiconductor material is separated into two layers by the phase separating to form the two semiconductor layers composed of the same material.

5. The method for forming the semiconductor thin film according to claim 1,
    wherein the forming comprises forming the semiconductor thin film using an organic semiconductor material and a high-molecular insulating material as the plurality of types of organic materials; and
    wherein the phase-separating comprises phase-separating the organic semiconductor material and the high-molecular insulating material.

6. The method for forming the semiconductor thin film according to claim 1,
    wherein the forming comprises forming the semiconductor thin film using a polycrystalline or crystalline organic semiconductor material and an amorphous high-molecular insulating material as the plurality of types of organic materials; and
    wherein the phase-separating comprises phase-separating the organic semiconductor material and the high-molecular insulating material.

7. The method for forming the semiconductor thin film according to claim 1, wherein when the layered structure is composed of a high-molecular material and a low-molecular material, a function extracted from the mixing Gibbs energy (ΔGm) of a material system containing the high-molecular material according to the Flory-Huggins theory represented by equation (1) below satisfies equation (2) below:

$$\Delta Gm = kN_T T(\chi_{12}\phi_1\phi_2) + kN_T T(\phi_1 \ln \phi_1 + \phi_2/x \cdot \ln \phi_2) \quad (1)$$

$$[(\chi_{12}\phi_1\phi_2) + (\phi_1 \ln \phi_1 + \phi_2/x \cdot \ln \phi_2)] \quad (2)$$

k . . . Boltzmann constant
$N_T$ . . . total number of lattice points ($N_T = N_1 + xN_2$)
wherein $N_1$ . . . number of low-molecular weight molecules
 $N_2$ . . . number of high-molecular weight molecules
 x . . . number of high-molecular weight units
 T . . . absolute temperature (K)
 $\chi_{12}$ . . . interaction parameter (Flory χ parameter)
 $\phi_1$ . . . $N_1/N_T$
 $\phi_2$ . . . $xN_2/N_T$.

8. The method for forming the semiconductor thin film according to claim 1, wherein when the layered structure is composed of a plurality of types of high-molecular materials, a function extracted from the mixing Gibbs energy (ΔGm) of a high-molecular material-high-molecular material system according to the Flory-Huggins theory represented by equation (3) below satisfies equation (4) below:

$$\Delta Gm = kN_T T(\chi_{12}\phi_1\phi_2) + kN_T T(\phi_1/x_1 \cdot \ln \phi_1 + \phi_2/x_2 \cdot \ln \phi_2) \quad (3)$$

$$[(\chi_{12}\phi_1\phi_2) + (\phi_1/x_1 \cdot \ln \phi_1 + \phi_2/x_2 \cdot \ln \phi_2)] > 0 \quad (4)$$

k . . . Boltzmann constant
$N_T$ . . . total number of lattice points ($N_T = N_1 + xN_2$)
wherein $N_1$ . . . number of high-molecular weight molecules 1
 $N_2$ . . . number of high-molecular weight molecules 2
 $x_1$ . . . number of units of high-molecular weight molecules 1
 $x_2$ . . . number of units of high-molecular weight molecules 2
 T . . . absolute temperature (K)
 $\chi_{12}$ . . . interaction parameter (Flory χ parameter)
 $\phi_1$ . . . $X_1 N_1/N_T$
 $\phi_2$ . . . $x_2 N_2/N_T$.

9. The method for forming the semiconductor thin film according to claim 1, wherein when the mixing Gibbs energy (ΔGm) represented by equation (1) or (3) below is determined as an equation of φ represented by equation (5) below, a plurality of materials constituting the layered structure have two minimum points:

$$\Delta Gm = kN_T T(\chi_{12}\phi_1\phi_2) + kN_T T(\phi_1 \ln \phi_1 + \phi_2/x \cdot \ln \phi_2) \quad (1)$$

$$\Delta Gm = kN_T T(\chi_{12}\phi_1\phi_2) + kN_T T(\phi_1/x_1 \cdot \ln \phi_1 + \phi_2/x_2 \cdot \ln \phi_2) \quad (3)$$

$$\phi = \phi_2/(\phi_1 + \phi_2) \quad (5)$$

k . . . Boltzmann constant
$N_T$ . . . total number of lattice points ($N_T = N_1 + xN_2$)
wherein $N_1$ . . . number of low-molecular weight molecules
 $N_2$ . . . number of high-molecular weight molecules
 x . . . number of high-molecular weight units
 T . . . absolute temperature (K)
 $\chi_{12}$ . . . interaction parameter (Flory χ parameter)
 $\phi_1$ . . . $N_1/N_T$
 $\phi_2$ . . . $xN_2/N_T$.

10. The method for forming the semiconductor thin film according to claim 1, wherein a high-molecular material having a number-average molecular weight and a weight-average molecular weight of 5,000 or more is used together with the organic semiconductor material as the plurality of types of organic materials.

11. The method for forming the semiconductor thin film according to claim 10, wherein the high-molecular material is poly(alpha-methylstyrene), polystyrene, or a cyclic olefin copolymer.

12. The method for forming the semiconductor thin film according to claim 1, wherein the organic semiconductor material is an acene material.

13. A method for manufacturing a thin-film semiconductor device comprising:
 forming the semiconductor thin film by applying or printing, on a substrate, a solution prepared by mixing a plurality of types of organic materials including an organic semiconductor material; and
 phase-separating the plurality of types of organic materials in a process for drying the semiconductor thin film to form a layered structure semiconductor thin film including a semiconductor layer composed of the organic semiconductor material, thereby forming a semiconductor thin film including at least two semiconductor layers by the phase separating, wherein phase-separating the plurality of types of organic materials comprises adjusting the molecular weight of a high-molecular material of the organic materials,
 wherein a mixing Gibbs energy of the plurality of types of organic materials has a positive value.

14. The method for forming the semiconductor thin film according to claim 13, wherein the plurality of types of organic materials comprises an organic insulating material is used.

15. The method for forming the semiconductor thin film according to claim 14, wherein the phase-separating comprises forming the semiconductor thin film including an intermediate layer, the intermediate layer comprising the organic insulating material and being sandwiched between the two semiconductor layers.

16. The method for forming the semiconductor thin film according to claim 13, wherein a same semiconductor material is separated into two layers by the phase separating to form the two semiconductor layers composed of the same material.

17. The method for forming the semiconductor thin film according to claim 13,
 wherein the forming comprises forming the semiconductor thin film using an organic semiconductor material and a high-molecular insulating material as the plurality of types of organic materials; and
 wherein the phase-separating comprises phase-separating the organic semiconductor material and the high-molecular insulating material.

18. The method for forming the semiconductor thin film according to claim 13,
 wherein the forming comprises forming the semiconductor thin film using a polycrystalline or crystalline organic semiconductor material and an amorphous high-molecular insulating material as the plurality of types of organic materials; and
 wherein the phase-separating comprises phase-separating the organic semiconductor material and the high-molecular insulating material.

19. The method for forming the semiconductor thin film according to claim 13, wherein when the layered structure is composed of a high-molecular material and a low-molecular material, a function extracted from the mixing Gibbs energy (ΔGm) of a material system containing the high-molecular material according to the Flory-Huggins theory represented by equation (1) below satisfies equation (2) below:

$$\Delta Gm = kN_T T(\chi_{12}\phi_1\phi_2) + kN_T T(\phi_1 \ln \phi_1 + \phi_2/x \cdot \ln \phi_2) \tag{1}$$

$$[(\chi_{12}\phi_1\phi_2) + (\phi_1 \ln \phi_1 + \phi_2/x_2 \cdot \ln \phi_2)] > 0 \tag{2}$$

k ... Boltzmann constant
$N_T$ ... total number of lattice points ($N_T = N_1 + xN_2$)
wherein $N_1$ number of low-molecular weight molecules
$N_2$ ... number of high-molecular weight molecules
x ... number of high-molecular weight units
T ... absolute temperature (K)
$\chi_{12}$ ... interaction parameter (Flory χ parameter)
$\phi_1$ ... $N_1/N_T$
$\phi_2$ ... $xN_2/N_T$.

20. The method for forming the semiconductor thin film according to claim 13, wherein when the layered structure is composed of a plurality of types of high-molecular materials, a function extracted from the mixing Gibbs energy (ΔGm) of a high-molecular material-high-molecular material system according to the Flory-Huggins theory represented by equation (3) below satisfies equation (4) below:

$$\Delta Gm = kN_T T(\chi_{12}\phi_1\phi_2) + kN_T T(\phi_1/x_1 \cdot \ln \phi_1 + \phi_2/x_2 \cdot \ln \phi_2) \tag{3}$$

$$[(\chi_{12}\phi_1\phi_2) + (\phi_1/x_1 \cdot \ln \phi_1 + \phi_2/x_2 \cdot \ln \phi_2)] > 0 \tag{4}$$

k ... Boltzmann constant
$N_T$ total number of lattice points ($N_T = N_1 + xN_2$)
wherein $N_1$ ... number of high-molecular weight molecules 1
$N_2$ ... number of high-molecular weight molecules 2
$x_1$ ... number of units of high-molecular weight molecules 1
$x_2$ ... number of units of high-molecular weight molecules 2
T ... absolute temperature (K)
$\chi_{12}$ ... interaction parameter (Flory χ parameter)
$\phi_1$ ... $X_1 N_1/N_T$
$\phi_2$ ... $X_2 N_2/N_T$.

* * * * *